(12) United States Patent
Shibata

(10) Patent No.: US 7,636,261 B2
(45) Date of Patent: Dec. 22, 2009

(54) SEMICONDUCTOR MEMORY DEVICE CAPABLE OF HIGH-SPEED CACHE READ OPERATION

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/625,062

(22) Filed: Jan. 19, 2007

(65) Prior Publication Data

US 2007/0171721 A1 Jul. 26, 2007

(30) Foreign Application Priority Data

Jan. 20, 2006 (JP) .............................. 2006-012650

(51) Int. Cl.
 *G11C 11/34* (2006.01)
(52) U.S. Cl. .............................. 365/189.03; 365/185.03
(58) Field of Classification Search ............ 365/185.03, 365/185.21
See application file for complete search history.

(56) References Cited

U.S. PATENT DOCUMENTS

| | | | | |
|---|---|---|---|---|
| 6,111,787 A | * | 8/2000 | Akaogi et al. ........... | 365/185.11 |
| 6,137,729 A | * | 10/2000 | Choi ..................... | 365/185.29 |
| 6,178,115 B1 | | 1/2001 | Shibata et al. | |
| 6,185,128 B1 | * | 2/2001 | Chen et al. ............. | 365/185.11 |
| 6,657,891 B1 | | 12/2003 | Shibata et al. | |

FOREIGN PATENT DOCUMENTS

| | | |
|---|---|---|
| JP | 2000-195280 | 7/2000 |
| JP | 2004-192789 | 7/2004 |

* cited by examiner

*Primary Examiner*—Michael T Tran
(74) *Attorney, Agent, or Firm*—Oblon, Spivak, McClelland, Maier & Neustadt, L.L.P.

(57) ABSTRACT

Primary data caches are connected to a common signal line, and secondary data caches are connected to an I/O data line. While data in the secondary data cache is being output to the I/O data line, the common signal line is used to make determinations for data in flag cells. This increases the speed of a cache read operation.

25 Claims, 15 Drawing Sheets

FIG. 1A Cache read

FIG. 1B Data re-read (first page)

FIG. 1C Fixation of output data to "1" (second page)

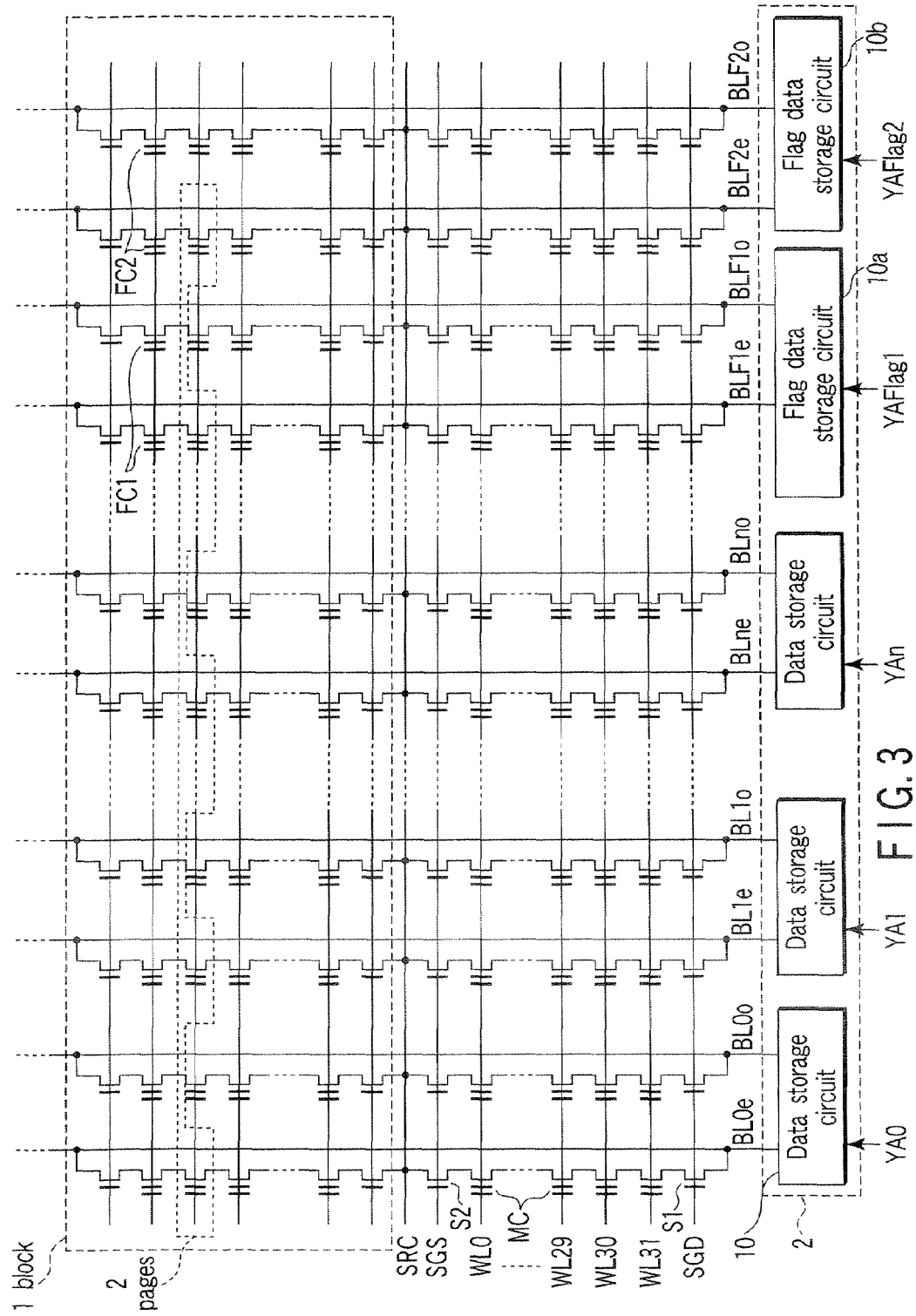
F I G. 3

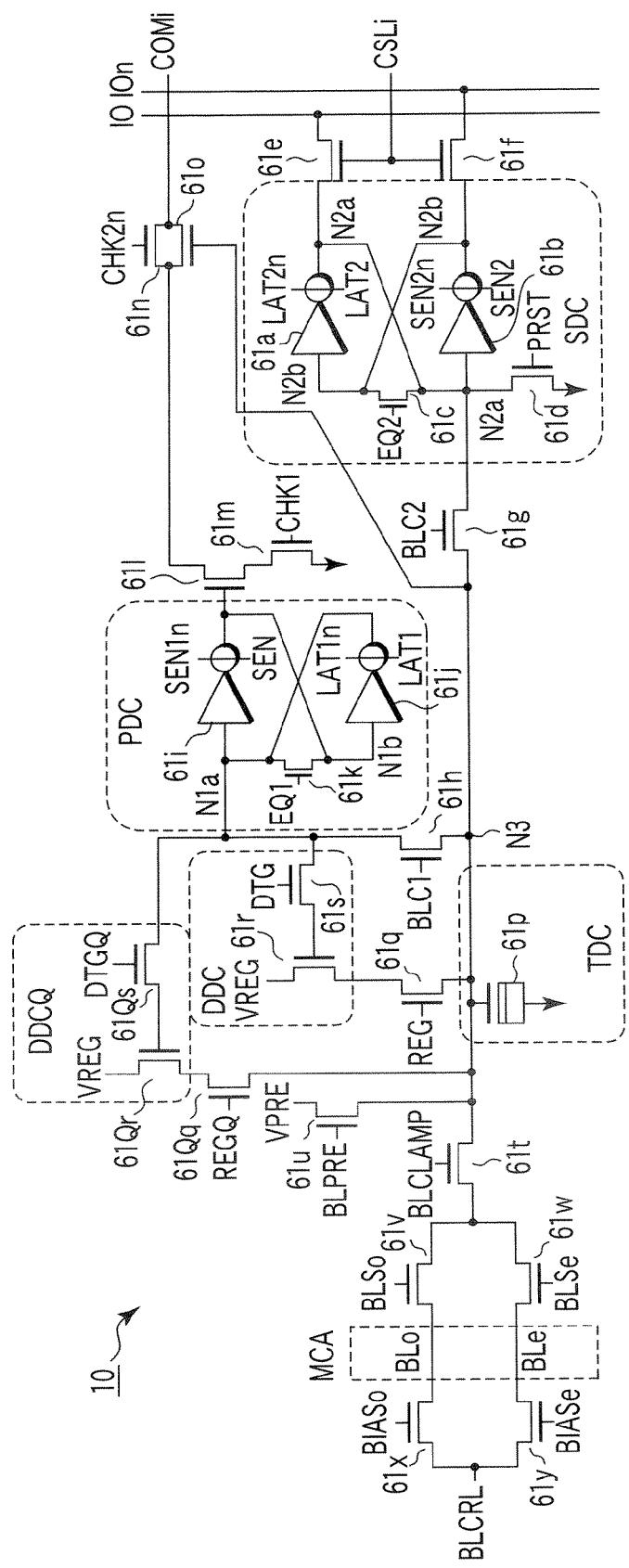
F I G. 6

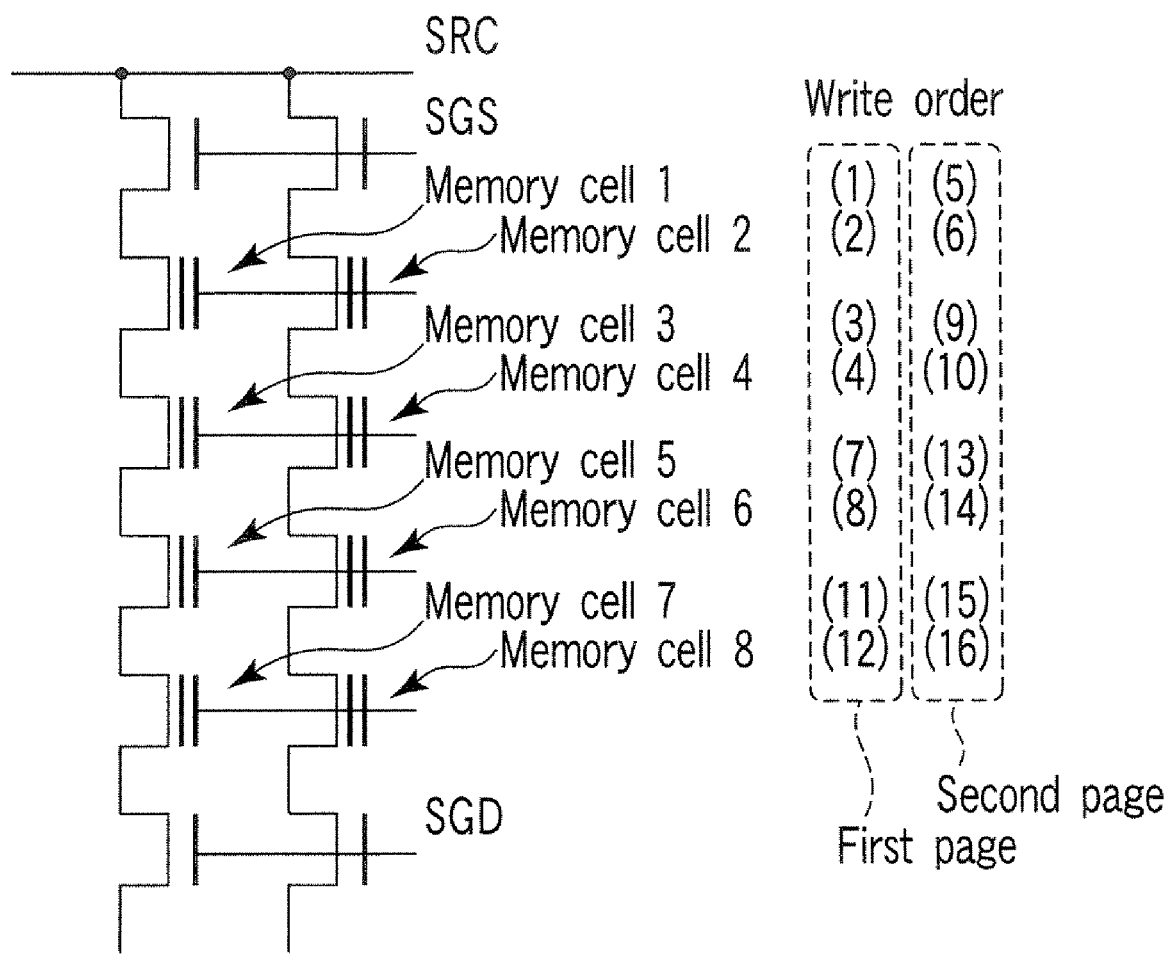
F I G. 7

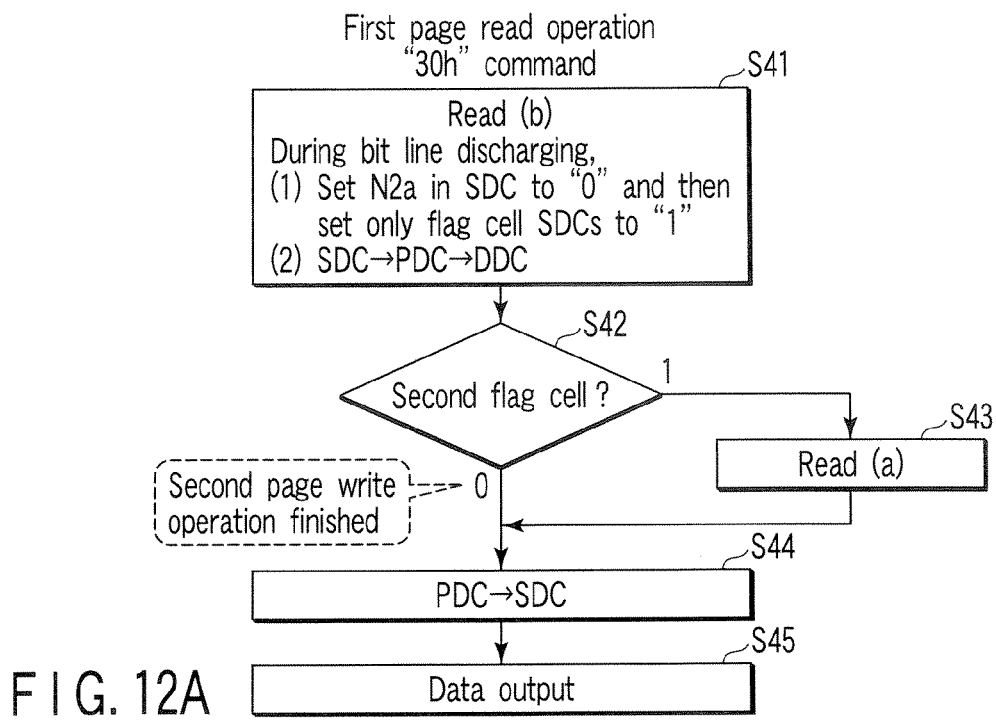
F I G. 12A
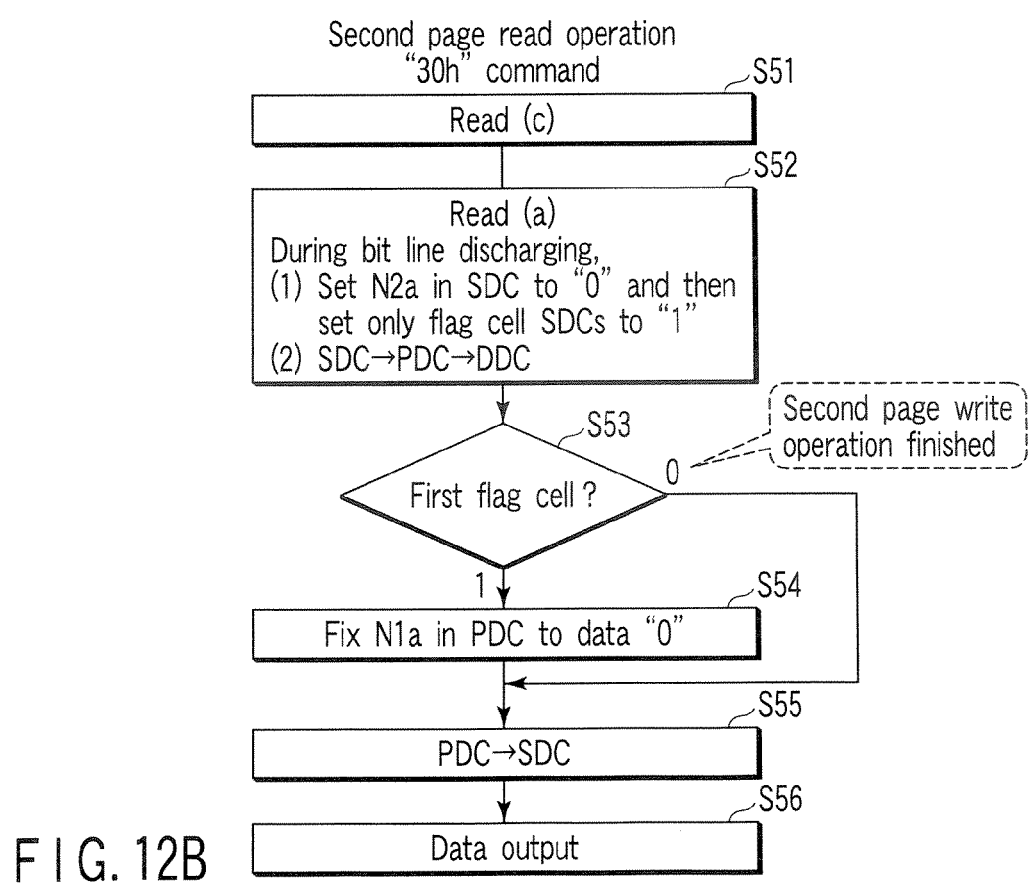
F I G. 12B

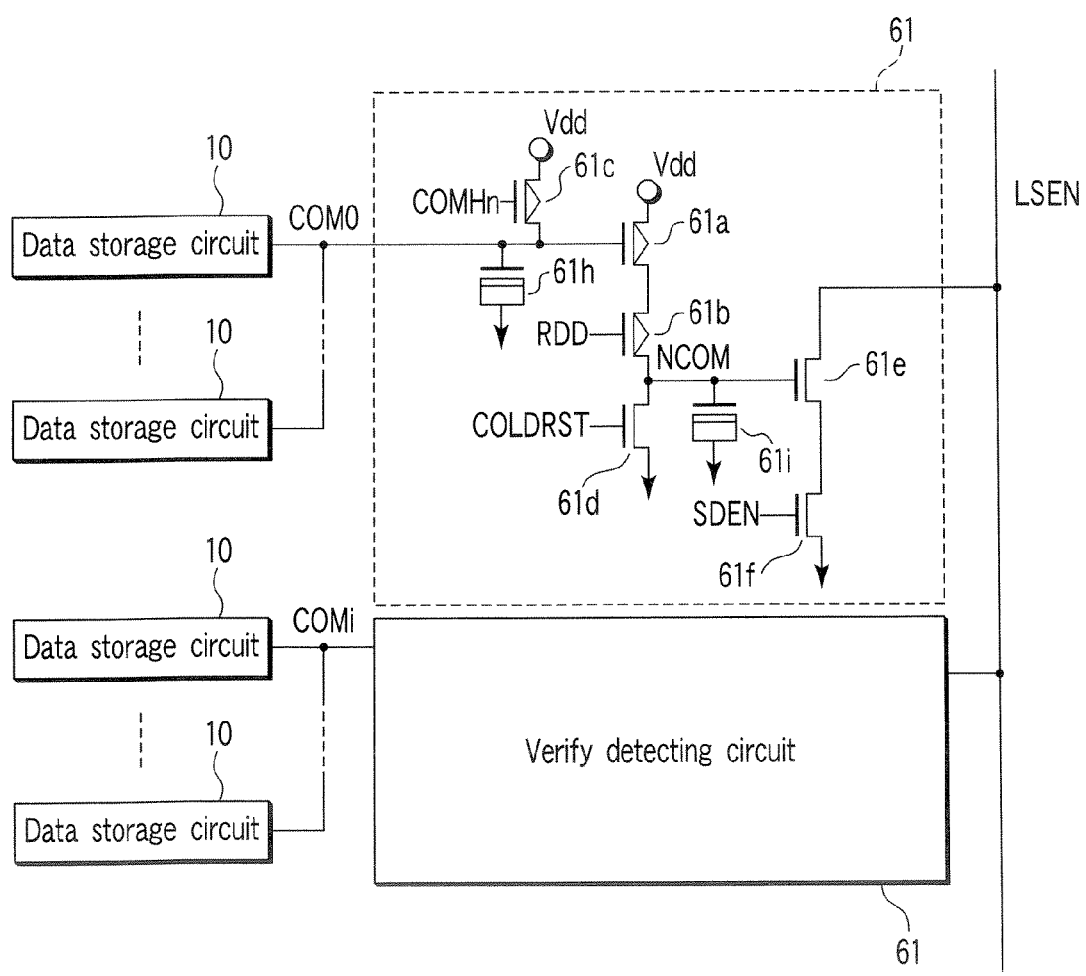
F I G. 16

SEMICONDUCTOR MEMORY DEVICE CAPABLE OF HIGH-SPEED CACHE READ OPERATION

CROSS-REFERENCE TO RELATED APPLICATIONS

This application is based upon and claims the benefit of priority from prior Japanese Patent Application No. 2006-012650, filed Jan. 20, 2006, the entire contents of which are incorporated herein by reference.

BACKGROUND OF THE INVENTION

1. Field of the Invention

The present invention relates to a NAND flash memory using, for example, EEPROM, and in particular, to a semiconductor memory device that can store multivalued data in each memory cell.

2. Description of the Related Art

In a NAND flash memory, a plurality of memory cells arranged in a column direction are connected together in series to constitute NAND cells, which are connected to corresponding bit lines via select gates. The bit lines are connected to latch circuits that latch write data and read data. Proposed NAND flash memories include nonvolatile semiconductor memory devices that can store multivalued data.

Elements have recently been increasingly miniaturized to reduce the distance between the cells. This has made the adverse effect of the floating gate capacitance between the adjacent cells more serious. Specifically, the threshold voltage of a cell on which a write operation has already been performed may disadvantageously be varied by the threshold voltage of a cell on which a write operation is subsequently performed. In particular, a multivalued memory in which 2 bits or more are stored in each cell stores a plurality of data using a plurality of threshold voltages. This requires the distribution of the threshold voltage for each data to be controllably significantly narrowed. This in turn results in the significant adverse effects of the threshold voltage of the adjacent cell.

To solve this problem, the following operation is performed. Before storing data in a memory cell in which 1 bit data (first page) has been stored, 1 bit (first page) data is written to the adjacent memory cell up to a threshold voltage (V-level) lower than the original one. After writing the data to the adjacent memory cell, a write operation on a second page write is performed with the threshold voltage raised to the original value (up to a word line voltage "b" (V<=B)). However, the write operation on the second page makes it impossible to determine whether the threshold voltage of the first page data is equal to or lower than the original one. Thus, to enable this determination, a proposed write scheme prepares a flag memory cell (hereinafter referred to as a flag cell) for each page and performs a read operation according to the flag cell data (see, for example, Jpn. Pat. Appln. KOKAI Publication No. 2000-195280).

Data read from a memory cell is first held in a first latch circuit and then output to the outside of the chip via a second latch circuit. While the data is being output to the outside of the chip via the second latch circuit, a read operation of reading the next read data from the memory cell to the first latch circuit can be performed (this operation is hereinafter referred to as cache read).

However, to reduce the area of the chip, only the second latch circuit can be connected to a device outside the chip. This configuration also applies to the flag cells. Flag cell data is read together with the corresponding memory cell data. Thus, in a cache read operation, the flag cell data cannot be distinguished from the memory cell data. Consequently, after the output of the data to the outside is finished, the data must be transferred from the first latch circuit to the second latch circuit to make a determination for the flag cell data. This disadvantageously reduces the speed of the cache read operation. It has thus been desirable to provide a semiconductor memory device that enables an increase in cache read speed.

BRIEF SUMMARY OF THE INVENTION

According to a first aspect of the invention, there is provided a semiconductor memory device comprising: a memory cell array having a plurality of memory cells arranged in rows and in columns, the memory cell array having a plurality of bit lines connected to the plurality of memory cells arranged in the columns; n (n is a natural number equal to or larger than 2) data storage circuits connected to the respective bit lines, each of the data storage circuits having a first storage section and a second storage section each of which stores 1 bit data; a common interconnection connected to the n first storage sections; and a control section, wherein k (k<n and is not 0) of the n data storage circuits store first logical data, (n−k) of the n data storage circuits store second logical data, and the control section reads data from the data storage circuits which store the first logical data, via the common interconnection.

According to a second aspect of the invention, there is provide a semiconductor memory device comprising: memory cells each having a threshold of k (k is a natural number equal to or larger than 2) values; a data storage circuit which stores either data read from the memory cell or externally input data, the data storage section having a first storage section and a second storage section each of which stores 1 bit; and a control circuit which performs a write operation of setting the memory cell to a threshold of n (n<=k) values according to the data in the first storage section and the second storage section and which, after at least one value is written to the memory cell, suspends the write operation, performs a read operation on the memory cells, stores read data in the first storage section, and then resumes the write operation.

According to a third aspect of the invention, there is provided a semiconductor memory device comprising: memory cells each having a threshold of k (k is a natural number equal to or larger than 2) values; a data storage circuit which stores either data read from the memory cell or externally input data, the data storage circuit having i (i is a natural number equal to or larger than 2) storage section each of which stores 1 bit; and a control circuit which performs a write operation of setting each of the memory cells to a threshold of n (n<=k) values according to the data in the storage sections and which, after at least one value is written to the memory cell, suspends the write operation, performs a read operation on the memory cells, stores read data in at least one of the storage sections, and then resumes the write operation.

According to a fourth aspect of the invention, there is provided a semiconductor memory device comprising: memory cells each having a threshold of k (k is a natural number equal to or larger than 2) values; a data storage circuit which stores either data read from the memory cell or externally input data, the data storage circuit having i (i is a natural number equal to or larger than 2) storage section each of which stores 1 bit; and a control circuit which performs a write operation of setting each of the memory cells to a threshold of n (n<=k) values according to the data in the storage section and which, after external input of a read command, suspends the write operation, performs a read operation on the memory cell, stores read data in at least one of the storage sections, and then resumes the write operation.

BRIEF DESCRIPTION OF THE SEVERAL VIEWS OF THE DRAWING

FIG. 3 is a diagram showing the configuration of a memory cell array and a bit line control circuit shown in FIG. 2;

FIG. 6 is a circuit diagram showing an example of a data storage circuit shown in FIG. 3;

FIG. 7 is a diagram showing the order of write operations on a NAND cell;

FIGS. 12A and 12B are flowcharts showing a read operation in accordance with the first embodiment;

FIG. 16 is a circuit diagram of a second embodiment showing an example of a verify detecting circuit.

DETAILED DESCRIPTION OF THE INVENTION

An embodiment of the present invention will be described below with reference to the drawings.

The present embodiment comprises a NAND flash memory in which a write operation is simultaneously performed on all or half of a plurality of cells arranged in a row direction and connected to respective write and read latch circuits through respective bit lines. Accordingly, the present embodiment further comprises a check circuit that checks whether or not all the latch data have been written. For a read operation, data is set so as to allow only the flag latch data to be sensed. The state of each flag cell is determined via the check circuit.

First Embodiment

Figure 2:
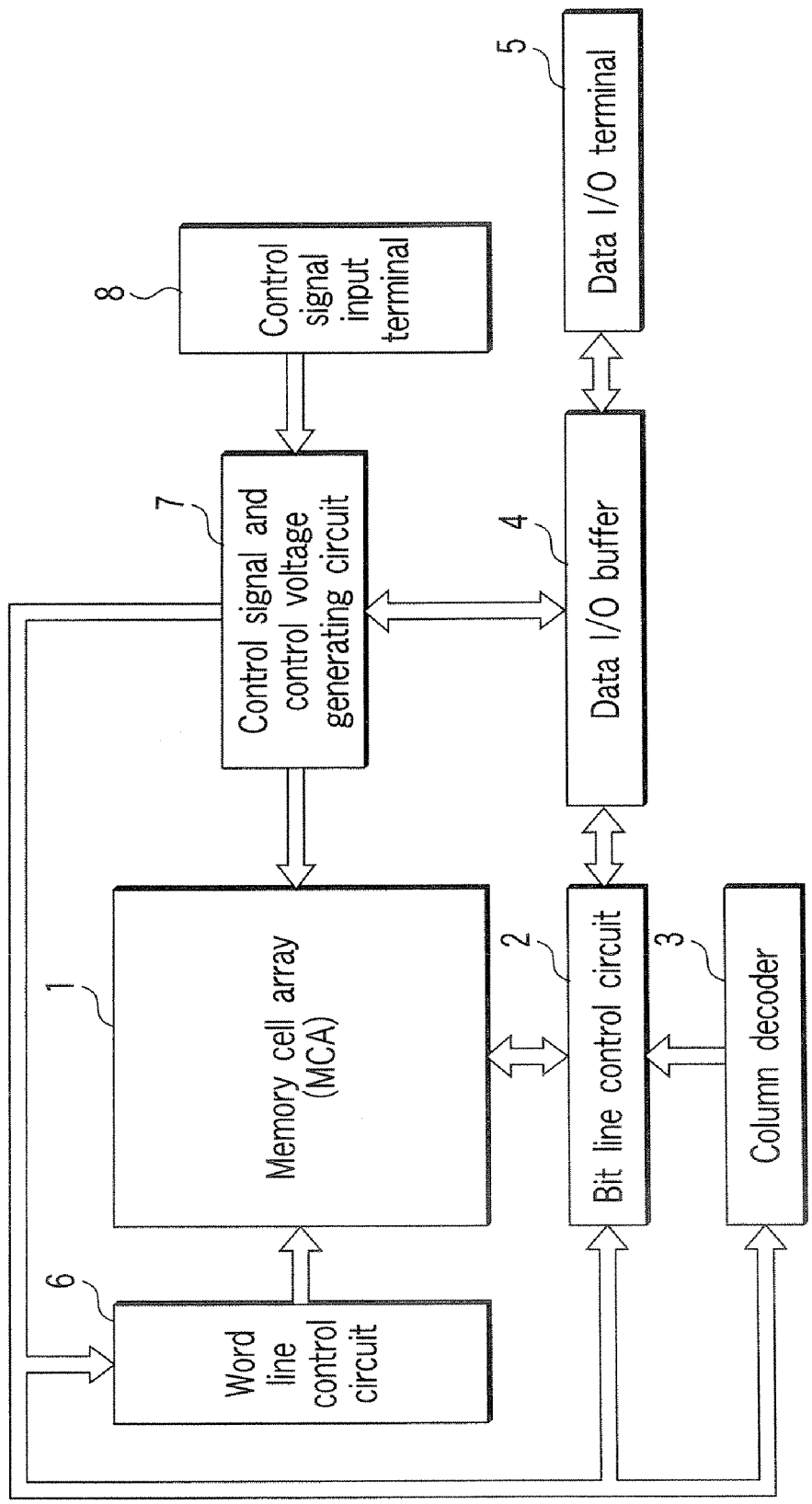
FIG. 2 is a diagram schematically showing a nonvolatile semiconductor memory device.

FIG. 2 schematically shows the configuration of a nonvolatile semiconductor memory device, for example, the configuration of a NAND flash memory that stores four values (2 bits).

A memory cell array 1 includes a plurality of bit lines, a plurality of word lines, and a common source line. The memory cell array 1 has electrically data rewritable memory cells arranged in a matrix and comprising, for example, EEPROM cells. A bit line control circuit 2 and a word line control circuit 6 are connected to the memory cell array 1; the bit line control circuit 2 controls the bit lines.

The bit line control circuit 2 includes a plurality of data storage circuits and a plurality of flag data storage circuits as described below. The bit line control circuit 2 reads data from a memory cell in the memory cell array 1 via the corresponding bit line, detects the state of a memory cell in the memory cell array 1 via the corresponding bit line, and applies a write control voltage to a memory cell in the memory cell array 1 via the corresponding bit line to write data to the memory cell. A column decoder 3 and a data I/O buffer 4 are connected to the bit line control circuit 2. The column decoder 3 selects any of the data storage circuits in the bit line control circuit 2. Data read from a memory cell to the data storage circuit is output to an external device through a data I/O terminal 5 via the data I/O buffer 4.

Write data externally input to the data I/O terminal 5 is input via the data I/O buffer 4 to the data storage circuit selected by the column decoder 3.

The word line control circuit 6 is connected to the memory cell array 1. The word line control circuit 6 selects any of the word lines in the memory cell array 1, and applies a voltage required for a read, write, or erase operation to the selected word line.

The memory cell array 1, bit line control circuit 2, column decoder 3, data I/O buffer 4, and word line control circuit 6 are connected to and controlled by a control signal and control voltage generating circuit 7. The control signal and control voltage generating circuit 7 is connected to a control signal input terminal 8 to generate signals and voltages required to write, read, or erase data in accordance with control signals externally input via the control I/O terminal 8.

The bit line control circuit 2, column decoder 3, word line control circuit 6, and control signal and control voltage generating circuit 7 constitute a write circuit and a read circuit.

FIG. 3 shows the configuration of the memory cell array 1 and bit line control circuit 2, shown in FIG. 2. A plurality of NAND cells are arranged in the memory cell array 1. Each NAND cell comprises 32 memory cells MC composed of, for example, EEPROMs, and select gates S1 and S2. The first select gate S1 is connected to bit lines BL0e to BLne, BLF1e, BLF2e, BL0o to BLno, BLF1o, and BLF2o. The second select gate S2 is connected to a source line SRC. Control gates of the memory cells arranged in each row are connected to the same one of the word lines WL0, WL1, WL2 to WL31. All the first select gates S1 are connected to a select line SGD. All the second select gates S2 are connected to a select line SGS.

The memory cell array 1 includes a plurality of blocks as shown by dashed lines. Each block comprises a plurality of NAND cells, and data is erased in terms of blocks. The erase operation is simultaneously performed on two bit lines connected to the data storage circuit 10 or to each of the flag data storage circuits 10a and 10b.

The bit line control circuit 2 has a plurality of the data storage circuits 10 and a plurality of the flag data storage circuits 10a and 10b. Pairs of bit lines (BL0e and BL0o), (BL1e and BL1o) ... (BLne and BLno), (BLF1e and BLF1o), and (BLF2e and BLF2o) are connected to the respective data storage circuits 10 and flag data storage circuits 10a and 10b.

A plurality of memory cells (enclosed by a dashed line) arranged on every other bit line and connected to one word line constitute one sector. Data is written to or read from each sector. Each sector stores, for example, two pages of data. Flag cells FC1 and FC2 are connected to each word line. In the present embodiment, each sensor includes the two flag cells FC1 and FC2.

The number of flag cells FC1 and FC2 provided for each sector is not limited to two. Three or more flag cells may be connected to each cell. In this case, determinations are made for the data stored in the flag cells by the majority of the data stored in a plurality of flag cells.

For a read operation, a program verify operation, and a program operation, one of the two bit lines (BL0e, BL0o, BL1e, BL10 . . . BLne, BLno . . . BLF1e, BLF1o, BLF2e, BLF2e, and BLF2o) connected to the data storage circuit 10 is selected in accordance with an external address. Further, in accordance with the external address, one word line is selected and one sector (for two pages) is selected. The two pages are switched in accordance with the address.

Figure 4A:
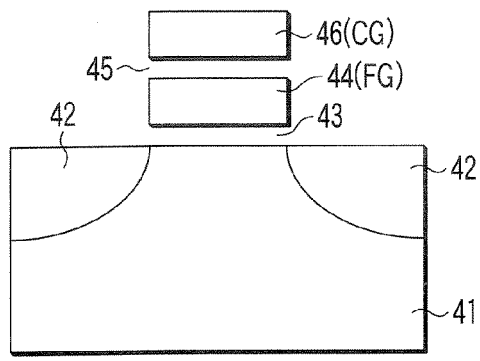
FIGS. 4A and 4B are sectional views showing a memory cell and a select transistor.
Figure 4B:
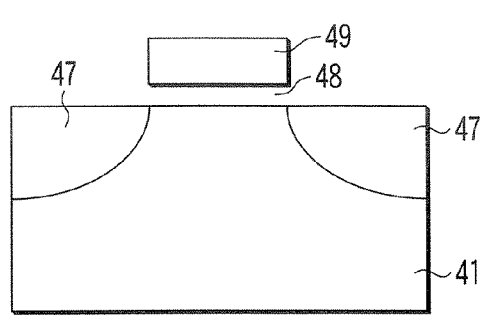

FIGS. 4A and 4B show sectional views of a memory cell and a select transistor, respectively. FIG. 4A shows a memory cell. N-type diffusion layers 42 are formed on a substrate 41 as a source and a drain of the memory cell. A floating gate (FG) 44 is formed on the substrate 41 via a gate insulating film 43. A control gate (CG) 46 is formed over the floating gate 44 via an insulating film 45. FIG. 4B shows a select gate. N-type diffusion layers 47 are formed on the substrate 41 as a source and a drain. A control gate 49 is formed over the substrate 41 via an insulating film 48.

Figure 5:
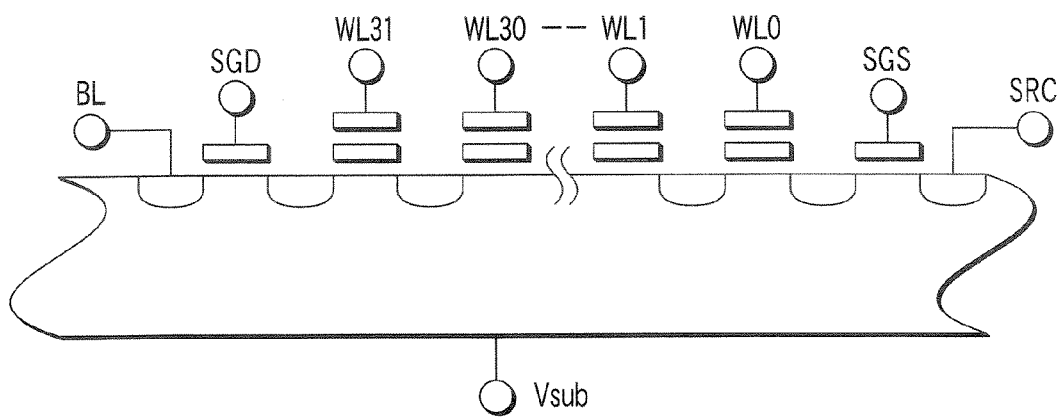
FIG. 5 is a sectional view showing a NAND cell in the memory cell array.

FIG. 5 shows a cross section of one NAND cell in the memory cell array. In this example, the NAND cell comprises 32 memory cells MC connected together in series; each of the memory cells MC is configured as shown in FIG. 4A. The first select gate S1 and second select gate S2 are provided on a drain side and a source side, respectively, of the NAND cell; each of the first select gate S1 and second select gate S2 is configured as shown in FIG. 4B.

FIG. 6 is a circuit diagram showing an example of the data storage circuit 10, shown in FIG. 3. The flag data storage circuits 10a and 10b are configured similarly to the data storage circuit 10.

The data storage circuit 10 has a primary data cache (PDC), a secondary data cache (SDC), a dynamic data cache (DDC), a dynamic data cache Q (DDCQ), and a temporary data cache (TDC). SDC, PDC, and DDC hold input data for a write operation, hold read data for a read operation, and temporarily hold data for a verify operation. SDC, PDC, and DDC are used to manipulate internal data in order to store multi-valued data. For a data read operation, TDC amplifies data on the corresponding bit line and temporarily holds the amplified data. To store multivalued data, TDC is used to manipulate internal data. For a data write operation described below, DDCQ stores data indicating whether or nor a verify level slightly lower than a particular one has been reached.

SDC comprises clocked inverter circuits 61a and 61b and transistors 61c and 61d all of which constitute a latch circuit. The transistor 61c is connected between an input terminal of the clocked inverter circuit 61a and an input terminal of the clocked inverter circuit 61b. A signal EQ2 is supplied to a gate of the transistor 61c. The transistor 61d is connected between an input terminal of the clocked inverter circuit 61b and a ground. A signal PRST is supplied to a gate of the transistor 61d. A node N2a in SDC is connected to an I/O data line IO via a column select transistor 61e. A node N2b in SDC is connected to an I/O data line IOn via a column select transistor 61f. A column select signal CSLi is supplied to a gate of each of the transistors 61e and 61f. The node N2a in SDC is connected to a node N1a in PDC via transistors 61g and 61h. A signal BLC2 is supplied to a gate of the transistor 61g. A signal BLC1 is supplied to a gate of the transistor 61h.

PDC comprises a clocked inverter circuit 61i and 61j and a transistor 61k. The transistor 61k is connected between an input terminal of the clocked inverter circuit 61i and an input terminal of the clocked inverter circuit 61j. A signal EQ1 is supplied to a gate of the transistor 61k. A node N1b in PDC is connected to a gate of a transistor 61l. One end of a current path extending through the transistor 61l is grounded via a transistor 61m. A signal CHK1 is supplied to a gate of the transistor 61m. The other end of the current path extending through the transistor 61l is connected to one end of a current path extending through transistors 61n and 61o constituting a transfer gate. A signal CHK2n is supplied to a gate of the transistor 61n. The gate of the transistor 61o is connected to a connection node between transistors 61g and 61h. A signal line COMi is connected to the other end of the current path extending through the transistors 61n and 61o. The signal line COMi is shared by all the data storage circuits 10 and indicates whether or not all the data storage circuits 10 have been verified. That is, as described below, once verification is completed, the node N1b in PDC changes to a low level. In this state, setting the signals CHK1 and CHK2n to a high level sets the signal line COMi to the high level if the verification is completed.

TDC comprises, for example, a MOS capacitor 61p connected between a connection node N3 between the ground and a connection node N3 between the transistors 61g and 61h. DDC is connected to the connection node N3 via a transistor 61q. A signal REG is supplied to a gate of the transistor 61q.

DDC comprises transistors 61r and 61s. A signal VREG is supplied to one end of a current path extending through the transistor 61r. The other end of the current path extending through the transistor 61q is connected to a current path extending through the transistor 61q. A gate of the transistor 61r is connected to the node N1a in PDC via the transistor 61s. A signal DTG is supplied to a gate of the transistor 61s.

DDCQ comprises transistors 61Qr and 61Qs. A signal VREG is supplied to one end of a current path extending through the transistor 61Qr. The other end of the current path extending through the transistor 61Qr is connected to the connection node N3 via a transistor 61Qq. A signal REGQ is supplied to a gate of the transistor 61Qq. A gate of the transistor 61Qr is connected to the node N1a in PCC via the transistor 61Qs. A signal DTGQ is supplied to a gate of the transistor 61Qs.

The connection node N3 connects to one end of a current path extending through transistors 61t and 61u. A signal VPRE is supplied to the other end of the current path extending through the transistor 61u. BLPRE is supplied to a gate of the transistor 61u. A signal BLCLAMP is supplied to a gate of the transistor 61t. The other end of the current path extending through the transistor 61t is connected to one end of the bit line BLo via a transistor 61v and to one end of the bit line BLe via a transistor 61w. The other end of the bit line BLo is connected to one end of a transistor 61x. A signal BIASo is supplied to a gate of the transistor 61x. The other end of the bit line BLe is connected to one end of a current path extending through a transistor 61y. A signal BIASe is supplied to a gate of the transistor 61y. A signal BLCRL is supplied to the other end of the current path extending through the transistor 61x and 61y. The transistors 61x and 61y are turned on complementarily to the transistors 61v and 61w in accordance with the signals BIASo and BIASe to supply the potential of the signal BLCRL to unselected bit lines.

The above signals and voltages are generated by the control signal and control voltage generating circuit 7, shown in FIG. 2. Operations described below are controlled by the control signal and control voltage generating circuit 7.

The memory in accordance with the present embodiment is multivalued and can store 2 bit data in each cell. The 2 bits are switched in accordance with an address (first page and second page).

FIG. 7 shows the order of write operations on a NAND cell. In a block, write operations are performed on each page of the memory cells starting with the one closest to the source line. FIG. 7 shows four word lines for convenience of description.

The first write operation writes 1 bit data to a first page of memory cell 1.

The second write operation writes 1 bit data to a first page of memory cell 2 adjacent to memory cell 1 in a word direction.

The third write operation writes 1 bit data to a first page of memory cell 3 adjacent to memory cell 1 in a bit direction.

The fourth write operation writes 1 bit data to a first page of memory cell 4 diagonally adjacent to memory cell 1.

The fifth write operation writes 1 bit data to a second page of memory cell 1.

The sixth write operation writes 1 bit data to a second page of memory cell 2 adjacent to memory cell 1 in the word direction.

The seventh write operation writes 1 bit data to a first page of memory cell 5 adjacent to memory cell 3 in the bit direction.

The eighth write operation writes 1 bit data to a first page of memory cell 6 diagonally adjacent to memory cell 3.

The ninth write operation writes 1 bit data to a second page of memory cell 3.

The tenth write operation writes 1 bit data to a second page of memory cell 4 adjacent to memory cell 3 in the word direction.

The eleventh write operation writes 1 bit data to a first page of memory cell 7 adjacent to memory cell 5 in the bit direction.

The twelfth write operation writes 1 bit data to a first page of memory cell 8 diagonally adjacent to memory cell 5.

The thirteenth write operation writes 1 bit data to a second page of memory cell 5.

The fourteenth write operation writes 1 bit data to a second page of memory cell 6 adjacent to memory cell 5 in the word direction.

The fifteenth write operation writes 1 bit data to a second page of memory cell 7.

The sixteenth write operation writes 1 bit data to a second page of memory cell 8 adjacent to memory cell 7 in the word direction.

(Description of Operations)

Figure 8A:
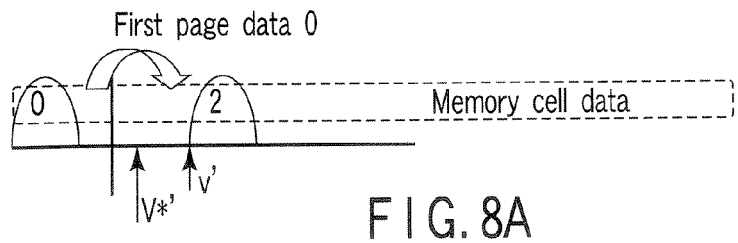
FIGS. 8A to 8D are diagrams showing the relationship between memory cell data and threshold voltages.
Figure 8B:
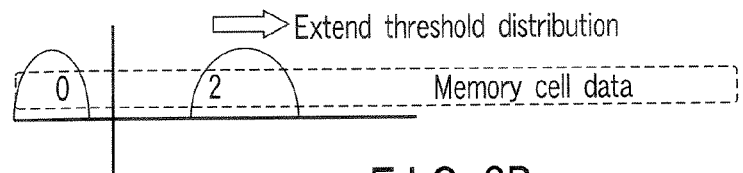

FIGS. 8A to 8D show the relationship between data in a memory cell and its threshold voltage. An erase operation zeroes the data in the memory cell. As shown in FIG. 8A, a writing operation on the first page provides the memory cell with data "0" and data "2". As shown in FIG. 8B, before a write operation on the second page, data with a threshold equal to or lower than that of actual data is written to the adjacent cell. Then, the data written to this cell extends the distribution of threshold voltage of the data "2".

Figure 8C:
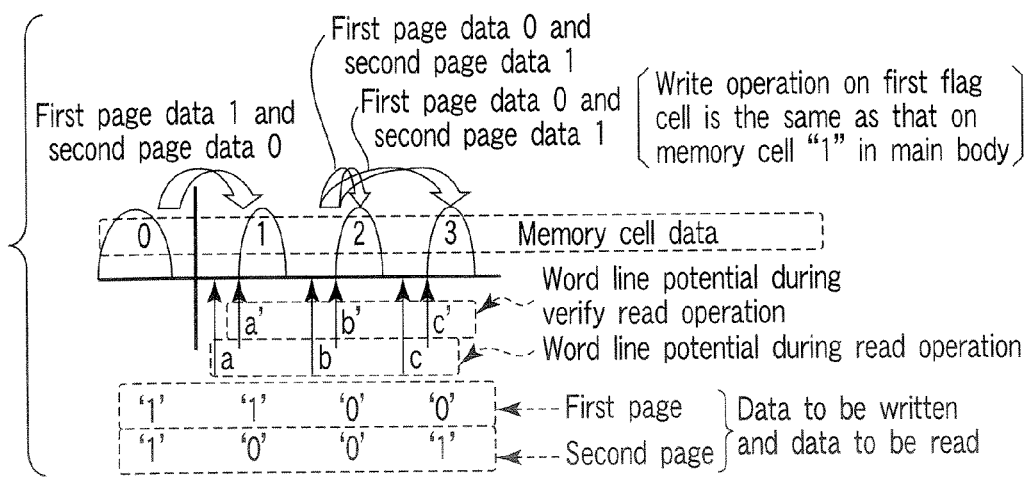

Then, as shown in FIG. 8C, a write operation is performed on the second page to provide it with data "0" to "3" having the original threshold voltage. In the present embodiment, the data in the memory cell is defined in order of increasing threshold voltage.

Figure 8D:
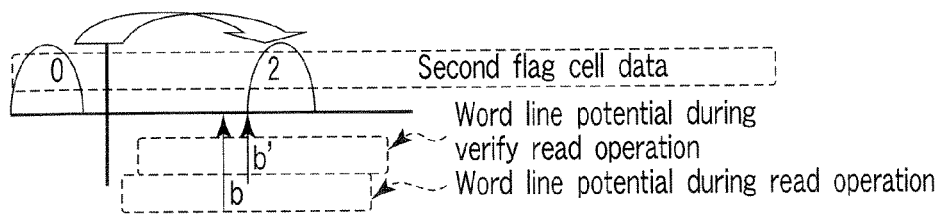

A flag cell is not written during the write operation on the first page but during the write operation on the second page as shown in FIGS. 8C and 8D.

In the present embodiment, the data in the memory cell is defined in order of increasing threshold voltage.

A program operation will be described with reference to FIGS. 6 to 10. The program operation is not essential to the present embodiment and can thus be varied.

(Program and Program Verify)

(First Page Program)

Figure 9:
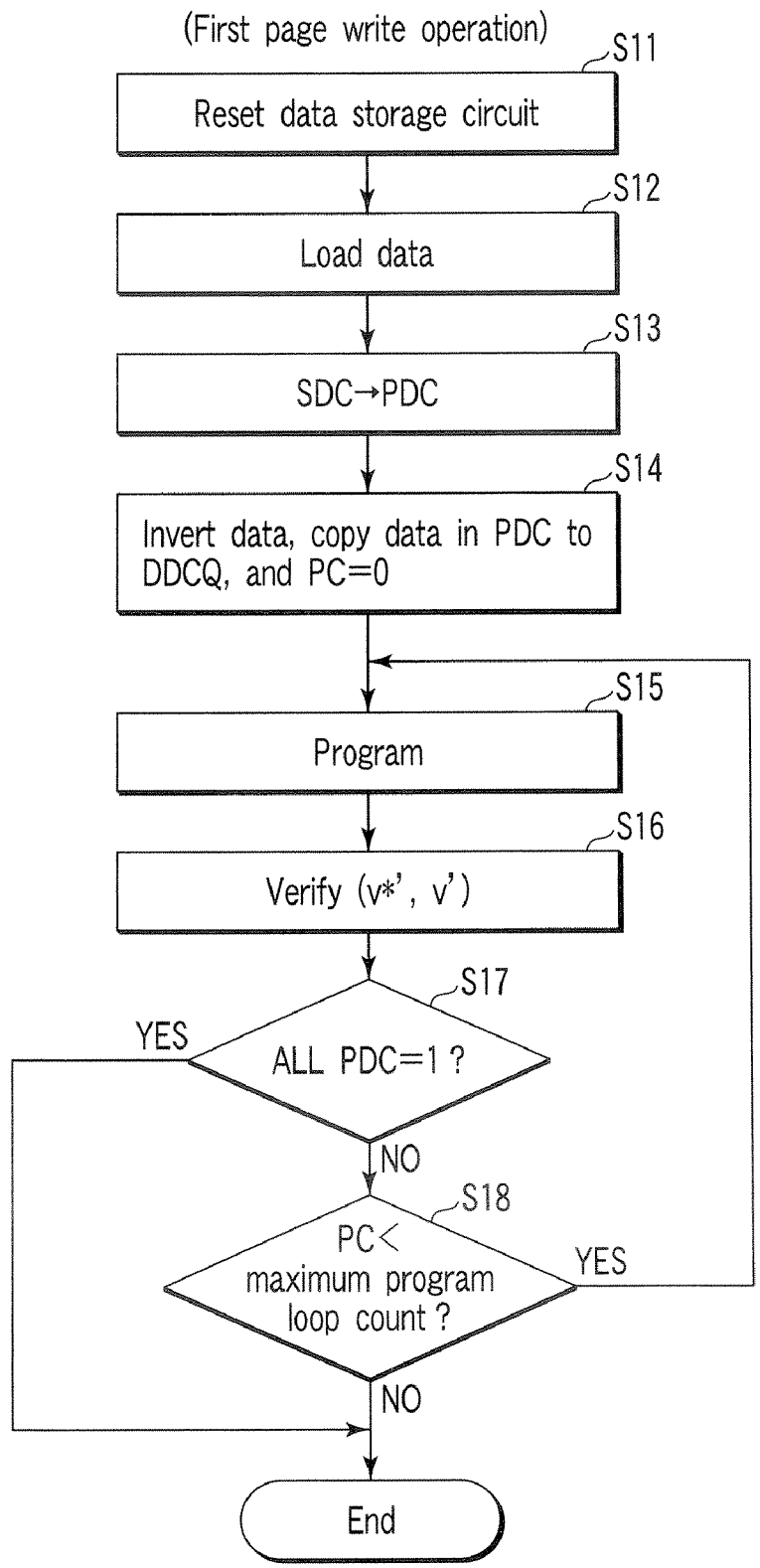
FIG. 9 is a flowchart showing an example of a first page program operation.

FIG. 9 shows a flowchart of first page programming. A program operation first specifies an address to select two pages (one sector) shown in FIG. 3. The memory can perform a program operation on the two pages only in order of the first page and second page. Consequently, the memory selects the first page in accordance with the address.

During the address input, the transistor 61*d*, shown in FIG. 6, is turned on by the signal PRST to reset the nodes N2*a* in all SDCs to a ground potential Vss (ST11).

Then, external write data is input and stored in SDCs in all the data storage circuits 10 (ST12). In this case, for a data write operation, external data "0" is input to set the node N2*a* in SDC to, for example, a power supply potential Vdd. For cells unselected for a write operation, external data "1" is input to set the node N2*a* in SDC to Vss. A subsequently input write command causes the data in SDCs in all the data storage circuits 10 to be transferred to PDCs (ST13). That is, the signals BLCL and BLC2 are set to a predetermined voltage, for example, Vdd+Vth (Vdd: for example, 3V or 1.8V but not limited to this voltage, Vth: the threshold voltage of an N channel MOS transistor) to turn on the transistors 61*h* and 61*g*. The data in the node N2*a* is then transferred to PDC via the transistors 61*g* and 61*h*. Thus, externally input data "1" (write operation is not performed) sets the node N1*a* in PDC to a low level. The input of data "0" (write operation is performed) sets the node N1*a* in PDC to a high level. Subsequently, the data in PDC has the potential of the node N1*a*. The data in SDC has the potential of the node N2*a*.

(Data Inverting Operation) (ST14)

Subsequently, the signal VPRE is set to Vdd and the signal BLPRE is set to Vdd+Vth to precharge the node N3 to Vdd. The signal DTG is thereafter set to Vdd+Vth and the data in PDC is transferred to DDC. Then, the signal REG is set to Vdd, and the signal VREG is set to Vss. If DDC stores the high level, the transistor 61*r* is turned on to set the node N3 to the low level. If DDC stores the low level, the transistor 61*r* is off with the node N3 remaining at the high level. Signals SEN1 and LAT1 are subsequently turned off to set the signal EQ1 to Vdd to set the nodes N1*a* and N1*b* to an equal potential. The signal BLC1 is subsequently set to Vdd+Vth, and the data in TDC (potential of the node N3) is transferred to PDC. As a result, if the data "1" is latched in PDC, it changes to "0". If the data "0" is latched in PDC, it changes to "1".

An input write command causes a booster circuit (not shown) in the control signal and control voltage generating circuit 7 which generates a program voltage Vpgm and an intermediate potential Vpass. These potentials do not rise immediately, so that during the corresponding standby time, the above data inverting operation is performed. This prevents a decrease in write speed.

The reason for the inversion of input data is as follows. To perform what is called a page copy operation of reading one page of data from a memory cell to the page buffer and writing it to the other page without outputting it to the external device, first, the read operation is performed. However, the written data (data "0") corresponds to "1" in SDC. The unwritten data (data "1") corresponds to "0" in SDC. Thus, the use of the inverted input data results in "1" in SDC if a write operation is performed and in "0" in SDC if a write operation is not performed. Consequently, the data in SDC matches the next data to be written to SDC. This enables only a part of read data to be easily externally input and changed. Accordingly, even if a page copy operation is not to be performed, the logic of externally input data is inverted in the page buffer.

Inputting a normal program command allows the above data inverting operation to be performed. Subsequently, the data in PDC is transferred to DDCQ.

During programming of the first page, no data is written to the flag cell. Thus, the data in PDC in the flag data storage circuits 10a and 10b is "1".

(Program Operation) (ST15)

The potential of the signal BLC1, BLCLAMP, BLSo, or BLSe, shown in FIG. 6, is set to Vdd+Vth. This turns on the transistor 61h, 61t, 61v, or 61w to supply the data held in PDC to the corresponding bit line. When the data "1" (write operation is not performed) is stored in PDC, the bit line is set to Vdd. When the data "0" (write operation is performed) is stored in PDC, the bit line is set to Vss (ground potential). No write operation must be performed on cells in an unselected page (cells with unselected bit lines) which are connected to a selected word line. Thus, the bit lines connected to these cells are supplied with Vdd as is the case with the data "1". Vdd is then supplied to the select line SG1 for a selected block. A voltage Vpgm (20V) and a potential Vpass (10V) are supplied to a selected word line and unselected word lines, respectively. Then, if the bit line is at Vss, the channel of the cell is set to Vss and the word line is set to Vpgm, allowing a write operation to be performed. If the bit line is at Vdd, the channel of the cell is not set to Vss and coupling causes the channel to be booted. This reduces the difference in potential between the gate and channel to about Vpgm/2 to prevent a write operation from being performed.

An original verify level "v'" and a lower verify level "v*'" are set for the multivalued memory, which narrows the distribution of threshold voltages. "*" hereinafter denotes a potential lower than the original value. Thus, for cells at a verify level exceeding "v*'" and at most "v'", the bit line is supplied with an intermediate voltage (voltage between Vdd and Vss, for example, 1V) to reduce the write speed. In this case, setting the signal VREG to Vdd and the signal REGQ to the intermediate voltage+Vth (for example, 1V+VTh) sets the bit line to the intermediate voltage if the bit line is at Vss and DDCQ is at the high level and keeps the bit line at Vss if DDCQ is at the low level. If the bit line is at Vdd, this voltage is maintained.

When the write data (data in PDC) is "0", the data in the memory cell is set to "2" as shown in FIG. 8A. When the write data is "1", the data in the memory cell remains "0".

(First Page Verify) (S16)

As shown in FIG. 8A, a first page write operation is performed up to the verify level "v'". Accordingly, in a first step, as shown in FIG. 8A, a verify operation is performed using the potential "v*'", which is lower than the potential "v'" to which the word line is set during the original verify operation. In a second step, the potential of the word line is set to "v'".

First, a read potential Vread is provided to unselected word lines in a selected block to set the select line SGD to the high level. A predetermined voltage, for example, Vdd+Vth, is supplied to the signal BLPRE for the data storage circuit 10, shown in FIG. 6. A predetermined voltage, for example, 1V+Vth, is supplied to the signal BLCLAMP for the data storage circuit 10. The signal VPRE is thus set to Vdd to precharge the bit line to 1V.

Then, the select line SGS on the source side of the cells is set to the high level. Cells with thresholds higher than "v*'" are turned off. This keeps the bit line at the high level. Cells with thresholds lower than "v*'" are turned on. This sets the corresponding bit line to Vss.

Then, a predetermined voltage, for example, Vdd+Vth is supplied to the signal BLPRE to set the signal VPRE to Vdd to precharge the connection node N3 of TDC to Vdd. The signal BLCLAMP is Subsequently set to a predetermined voltage, for example, 0.9V+Vth to turn on the transistor 61t. The node N3 of TDC is set to the low level if the bit line is at the low level and to the high level if the bit line is at the high level.

Then, to perform a write operation, the low level is stored in DDCQ in FIG. 6. To avoid performing a write operation, the high level is stored in DDCQ. Thus, setting the signal VREG to Vdd and the signal REGQ to the high level forcibly sets the node N3 of TDC to the high level only if a write operation is not performed. After this operation, the data in PDC is transferred to DDCQ, and the potential of TDC is transferred to PDC. The high level signal is latched in PDC only if a write operation is not performed on the cell and if data "2" has been written to the cell to allow the threshold voltage to reach the verify potential "v*'". The low level signal is latched in PDC if the threshold voltage of the cell does not reach "v*'".

Then, raising the potential of the word line from "v*'" to "v'" turns on cells with threshold voltages lower than "v'" and sets the bit line to Vss.

Then, a predetermined voltage, for example, Vdd+Vth is supplied to the signal BLPRE to set the signal VPRE to Vdd to precharge the connection node N3 of TDC to Vdd. The signal BLCLAMP is subsequently set to a predetermined voltage, for example, 0.9V+Vth to turn on the transistor 61t. The node N3 of TDC is set to the low level if the bit line is at the low level and to the high level if the bit line is at the high level.

Then, to perform a write operation, the low level is stored in DDCQ in FIG. 6. To avoid performing a write operation, the high level is stored in DDCQ. Thus, setting the signal VREG to Vdd and the signal REGQ to the high level forcibly sets the node N3 of TDC to the high level only if a write operation is not performed. After this operation, the data in PDC is transferred to DDCQ, and the potential of TDC is transferred to PDC. The high level signal is latched in PDC only if a write operation is not performed on the cell and if data "2" has been written to the cell to allow the threshold voltage to reach the verify potential "v'". The low level signal is latched in PDC if the threshold voltage of the cell does not reach "v'".

As a result, DDCQ is set to the high level if the threshold of the cell exceeds "v*'", with the cell unselected for a write operation. DDCQ is set to the low level if a write operation has been performed to set the threshold voltage of the cell equal to or lower than "v*'". PDC is set to the high level if the threshold voltage of the cell exceeds "v'" with the cell unselected for a write operation. PDC is set to the low level if a write operation has been performed to set the threshold voltage of the cell equal to or lower than "v'".

If PDC is at the low level, a write operation is performed again and the program and verify operations are repeated until the data in all the data storage circuit 10 are set to the high level (S18 to S15). However, if PDC is at the low level and DDCQ is at the high level, respectively, that is, if the threshold voltage is at least "v*'" and at most "v'", the bit line is set to the intermediate voltage to reduce the write speed.

The above program operation is performed provided that the value in a program counter PC cleaned in step 14 is smaller than the maximum program count.

(Batch Sensing)

Whether or not the nodes N1*a* in all PDCs have been set to the high level is determined as follows. A signal line COM in FIG. 6 is connected to all the data storage circuits 10. First, the signal line COM is precharged to Vdd. Subsequently, the signal CHK2*n* is set to the high level and the signal CHK1 is then set to the high level. If the nodes N1*a* in all PDCs are at the high level, the signal line COM remains at Vdd. However, if the node N1*a* in any PDC is at the low level, the signal line COM changes to the low level.

(Adjacent Cell Programming)

As shown in FIG. 7, after being written to the first page of memory cell 1, 1 bit data is sequentially written to the first page of memory cell 2 adjacent to memory cell 1 in the word direction, to the first page of memory cell 3 adjacent to memory cell 1 in the bit direction, and to the first page of memory cell 4 diagonally adjacent to memory cell 1. These write operations cause the threshold voltage of memory cell 1 to be raised by an inter-floating-gate capacitance depending on the write data. This extends the distribution of threshold voltages of the data "0" and data "2" in memory cell 1 toward the higher voltage as shown in FIG. 8B.

Subsequently, the fifth write operation shown in FIG. 7 writes 1 bit data to the second page of memory cell 1.

(Second Page Programming)

Figure 10:
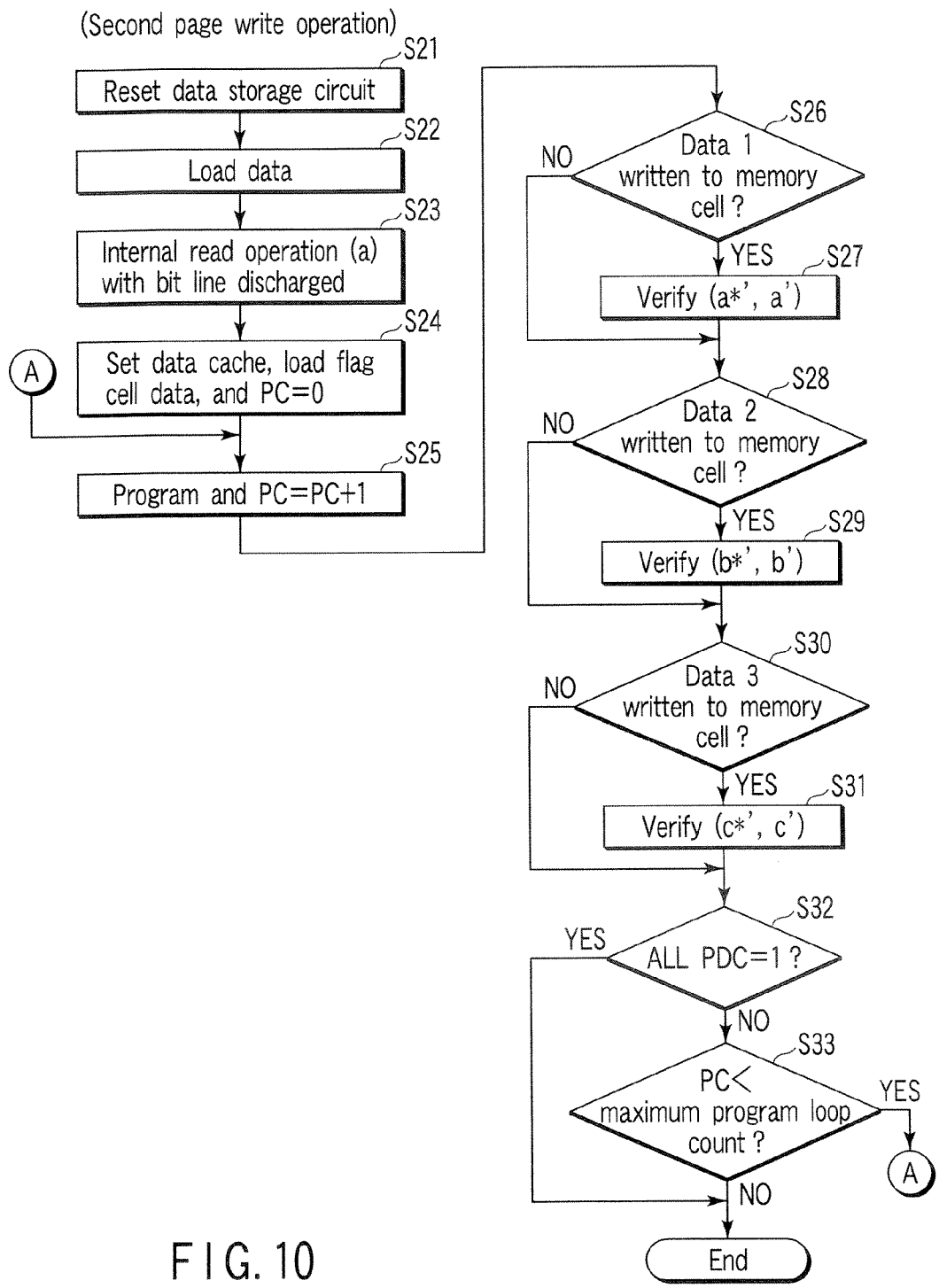
FIG. 10 is a flowchart showing an example of a second page program operation.

FIG. 10 is a flowchart showing an example of second page programming. A second page program operation first selects the two pages shown in FIG. 3 in accordance with the address. At the same time, SDC as a page buffer is reset (S21).

Then, external write data is input and stored in SDC in all the data storage circuits (S22). Externally input data "1" (write operation is not performed) sets the node N2*a* in SDC in the data storage circuit 10 to the low level. Externally input data "0" (write operation is performed) sets the node N2*a* in SDC in the data storage circuit 10 to the high level.

(Internal Data Read) (S23)

Before writing data to the cell, it is necessary to determine whether the data in the first page of the memory cell is "0" or "2". Thus, an internal read operation is performed to read data from the memory cell. The internal read operation is exactly the same as the read operation. To determine whether the data in the memory cell is "0" or "2", the selected word line is provided with a reading potential "b". However, the first page program operation has written the data "2" only up to "v'", which is lower than the normal value. Thus, the threshold voltage of the memory cell may be lower than the potential "b". Consequently, the internal data read operation supplies a potential "a" to the word line.

After the internal data read operation and during a first page write operation, writing no data sets the data in PDC to the low level ("0"), whereas writing data sets the data in PDC to the high level ("1").

(First Data Cache Setting) (S24)

Subsequently, the data cache is operated to set the data in SDC, DDC, and TDC as described below in accordance with the data in the memory cell after the write operations.

If the data in the memory cell after the write operations is "0",
then SDC=1, DDC=1, DDCQ=1, and PDC=1.

If the data in the memory cell after the write operations is 1,
then SDC=1, DDC=0, DDCQ=0, and PDC=0.

If the data in the memory cell after the write operations is "2",
then SDC=0, DDC=1, DDCQ=0, and PDC=0.

If the data in the memory cell after the write operations is "3",
then SDC=0, DDC=0, DDCQ=0, and PDC=0.

The operation of the data cache is not essential to the present embodiment and is not specifically described.

During the setting 1 of the data cache or the internal read operation, the flag cell data is also loaded. The program counter PC is further cleared.

A first flag cell FC1 is set to the memory cell data "1". The memory cell data "2" is written to a second flag cell FC1. The data caches connected to each memory cell and each flag cell are set to the data stored in the memory cell after the write operations.

(First Step) (S25)

Then, data is written to the memory cell. First, setting the signal BLC1 to Vsg (Vdd+Vth, for example, 2.5V+Vth) sets the bit line to Vss if the data in PDC is "0" and to Vdd if the data in PDC is "1". Then, the signal BLC1 is set to Vss, and the signals VREG and REGQ are set to Vdd and the intermediate potential+Vth (1V+Vth), respectively. Then, if the bit line is at Vss, it is set to the intermediate voltage (1V).

In this case, when the selected word line is at Vpgm and the unselected word lines are at Vpass, if the bit line is at Vdd, a write operation is not performed. If the bit line is at Vss, a write operation is performed. If the bit line is at the intermediate potential (1V), only a small amount of data is written.

(Verification at a Second Step Verify Level "a") (S26 and S27)

After the above program operation, verify voltages "a*'" and "a'" are sequentially set for the word line to perform a write verify operation. The verify procedure is the same as that for the first page. However, cells to which the data "2" or "3" has been written pass the verify operation. Accordingly, the signals VPRE and VREG are set to the high level. Instead of charging TDC to Vdd, SDC is set to the high level to charge TDCs in only the memory cells to which the data "1" has been written, to Vdd. This operation prevents the memory cells to which the data "2" or "3" has been written pass the verify operation.

(Verification at a Second Step Verify Level "b") (S28 and S29)

Subsequently, verify voltages "b*'" and "b'" are sequentially set for the word line to perform a write verify operation. The verify procedure is the same as that for the first page. However, cells to which the data "3" has been written pass the verify operation. Accordingly, the signals VPRE and VREG are set to the high level. Instead of charging TDC to Vdd, the signal REG is set to the high level to charge TDCs in only the memory cells to which the data "2" has been written, to Vdd. This operation prevents the memory cells to which the data "3" has been written pass the verify operation.

(Verification at a Second Step Verify Level "c") (S30 and S31)

Subsequently, verify voltages "c*'" and "c'" are sequentially set for the word line to perform a write verify operation. The verify procedure is the same as that for the first page.

After the second step of the second page write operation, the contents of the data cache are as follows.

If the data in the memory cell after the write operations is "0",
then SDC=1, DDC=1, DDCQ=0/1, and PDC=1.

If the data in the memory cell after the write operations is "1",
then SDC=1, DDC=0, DDCQ=0/1, and PDC=1.

If the data in the memory cell after the write operations is "2",
then SDC=0, DDC=1, DDCQ=0/1, and PDC=1.

If the data in the memory cell after the write operations is "3",
then SDC=0, DDC=0, DDCQ=0/1, and PDC=0.

The program operation and verify operations are repeated as described above until the data in all PDCs are set to "1". During the verify operation, writing of the data "1" is finished early. Thus, when no more cells require writing of the data "1", verification with the verify voltages (a*' and a') is not executed. When no more cells require a write operation with the data "1", verification with the verify voltages (b*'and b') is not executed.

The first page write operation uses only PDC and DDCQ but not SDC or DDC. During the second page write operation, writing of the data "1" is finished early. Thus, once a write operation with the data "1" is finished, only PDC, DDCQ, and DDC are used but not SDC. Once writing of the data "2" is finished, only PDC and DDCQ are used but not SDC or DDC. Therefore, if any SDC or any SDC and DDC are not used for a write operation, the outside of the chip can be set ready to input the next write data to SDC or both SDC and DDC. Thus, programming can be achieved using unused SDC or unused SDC and DDC as a cache.

Figure 11A:
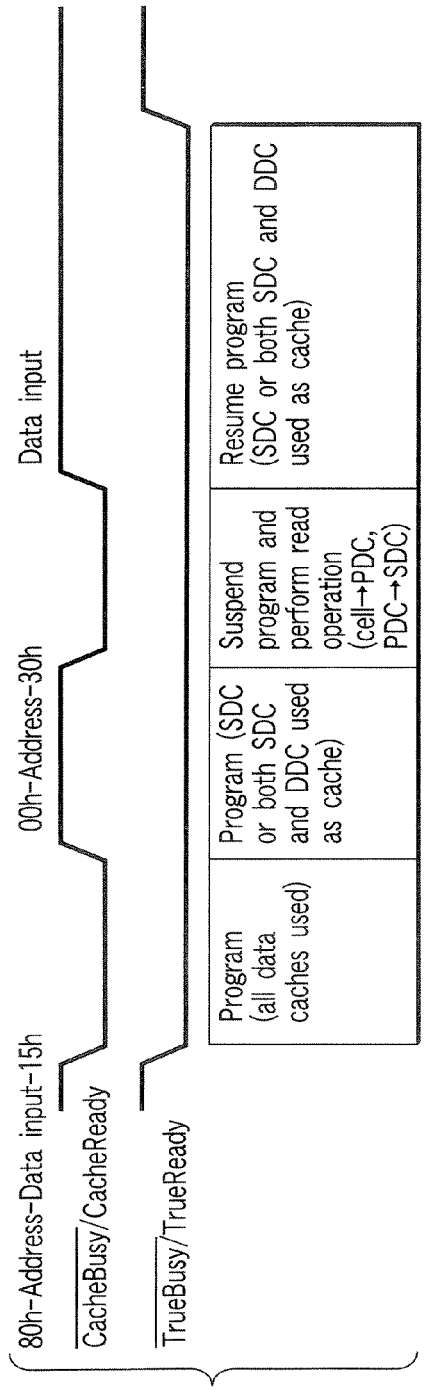
FIGS. 11A and 11B are timing charts showing timings for operations performed if caches are used.

That is, as shown in FIG. 11A, if SDC or both SDC and DDC become available, for example, after the issuance of a program command 15h (h denotes a hexadecimal number) from a host (not shown) outside the chip indicating the use of a cache, the outside of the chip is set ready to allow a read start command 30h to be accepted. Thereafter, if the read start command is input, the write (program) operation is suspended and a read operation is performed. The result of the read operation is held in SDC or both SDC and DDC. Then, the last write operation may be resumed during the output of result of the read operation to the external device (program resumption).

That is, in FIG. 6, if SDC is available, the outside of the chip is set ready to allow the read start command 30h to be accepted. Thereafter, if the read start command is input and SDC and DDC become available, the write (program) operation is suspended and the data in PDC is transferred to DDC. A read operation is subsequently performed and the read data is held in PDC. The data in PDC is subsequently transferred to SDC. While the data held in SDC is being output to the external device, the data saved to DDC is returned to PDC. The last write operation is then resumed.

Figure 11B:
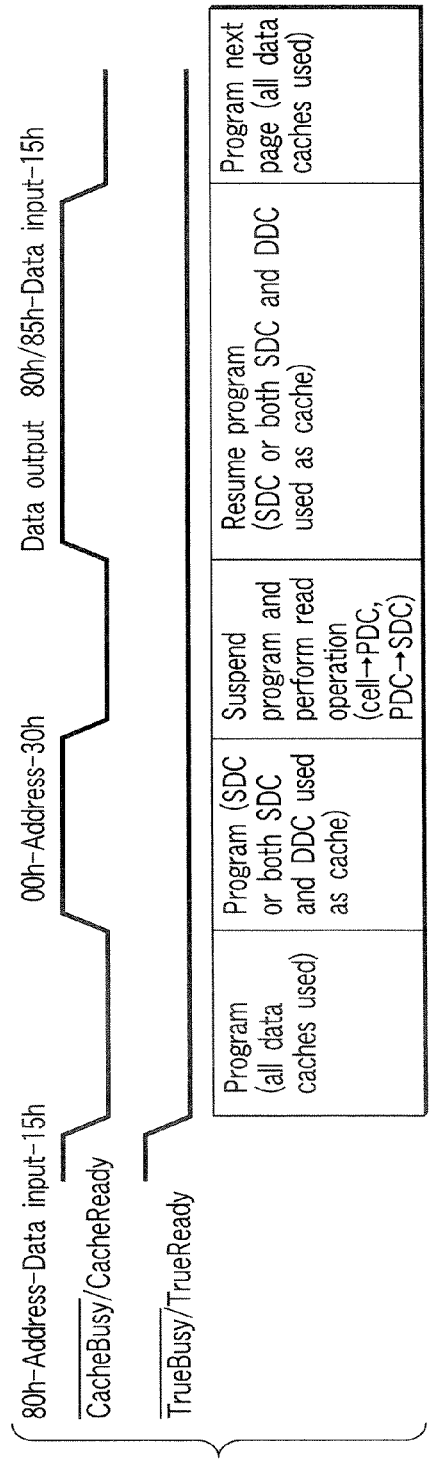

FIG. 11B shows that after the read operation, a page copy operation of changing only a part of the data for programming is performed. In this case, after the read operation, a command 85h for address input and the program command 15h are received without resetting SDC. Only a part of the data is changed for programming. Reference numeral 80h denotes an address data input command used for operations other than the page copy.

In the present embodiment, in FIG. 6, if SDC is available, the outside of the chip is set ready to allow the read start command 30h to be accepted. If SDC and DDC become available, the write (program) operation is suspended and a read operation is performed. The read data is subsequently transferred to SDC and then output to the external device. During the output, the last write operation is then resumed.

However, the data may be read from the cell and transferred directly to SDC. In this case, with the outside of the chip set ready, immediately after the acceptance of the read start command 30h, the write (program) operation is suspended to allow a read operation to be performed.

If another latch circuit is provided and the data in SDC is stored in the latch circuit so that it can serve as SDC, SDC is free from the beginning of the program operation. Thus, if the outside of the chip is set ready at the beginning of the program operation to allow the read start command 30h to be accepted, when the read command is then input, the following is carried out: when DDC becomes available or immediately after the input of the read command, the write (program) operation is suspended and a read operation is performed. The read data is subsequently transferred to SDC and then output to the external device. During the output, the last write operation may be resumed.

(Read)

A conventional cache read operation involves the input of an address input command 00h and an address and the subsequent input of the read start command 30h, bringing the semiconductor memory device into a busy state. In this state, the data read from the cell is held in PDC. The data in PDC is subsequently transferred to SDC, bringing the semiconductor memory device into the ready state. Thus allows the data in SDC to be output.

The subsequent input of a cache read command 31h causes the data in PDC to be transferred to SDC. In the subsequent ready state, the data in SDC can be output. The cache read command 31h enables the optional specification of the next address to be read, internal automatic incrementation to the next page, and internal automatic decrementation to the preceding page. The cache read command 31h reads the next read page data from the cell to PDC during the output of the data from SDC. This operation is repeated to enable data to be read at a high speed.

However, during a first page cache read operation, if a re-read operation is performed using the flag cell data in accordance with the command 31h, then after the issuance of the command 31h, the following operation is performed in the busy state. First, the data is transferred from PDC to SDC, and the flag cell data is checked. In accordance with the check result, the data is read from the memory cell, held in PDC, and then transferred to SDC. This disadvantageously increases the period of the busy state. The reason is that the data in PDC cannot be output to the outside of the data storage circuit before it is transferred to SDC as shown in FIG. 6.

Also during a second page cache read operation, if the data in SDC is set to "1" according to the result of check of the flag cell data after the issuance of the command 31h, the busy state disadvantageously lasts long after the issuance of the command 31h.

The first embodiment can thus reduce the period of the busy state after the issuance of the cache command.

Figure 13:
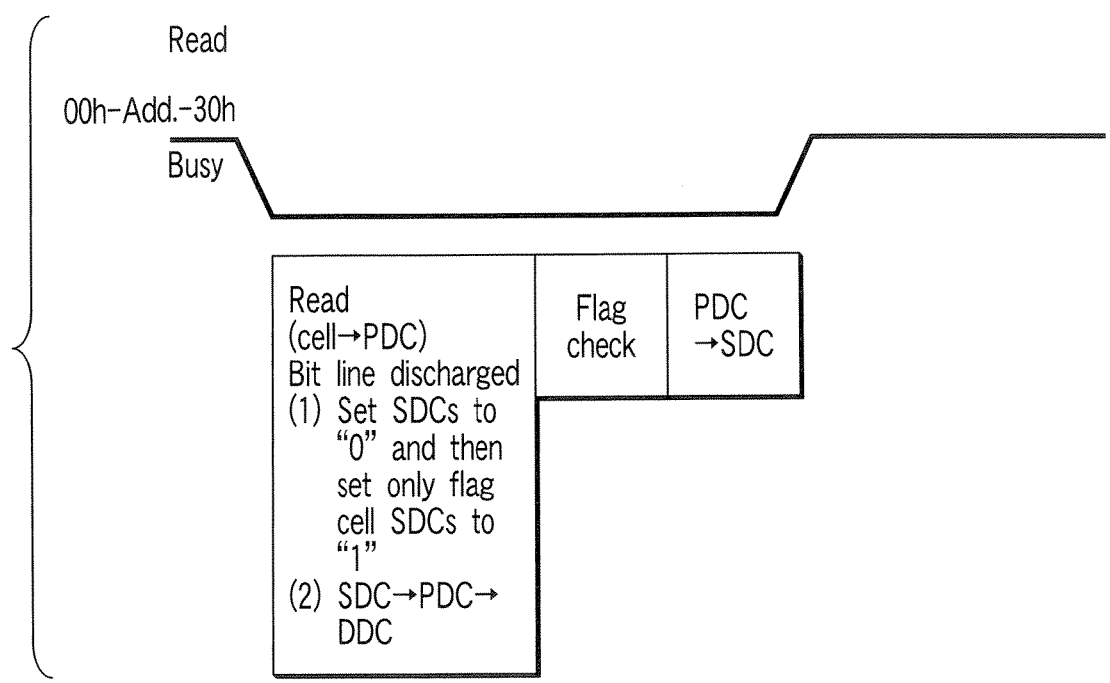
FIG. 13 is a timing chart showing a read operation in accordance with the first embodiment.

FIGS. 12A and 12B show flowcharts of a read operation in accordance with the first embodiment. FIG. 13 shows a timing chart of the read operation.

(First Page Read)

FIGS. 12A and 13 show diagrams of a first page read operation. First, an address is specified to select two pages shown in FIG. 3. As shown in FIGS. 8A, 8B, and 8C, a second page write operation changes the distribution of threshold voltages. Accordingly, to determine whether the data in the second flag cell is "0" or "1", first, a read operation is performed with the potential of the word line set to "b". During the read operation, the data in the nodes N2a in SDCs in all the data storage circuits are set to "0", and then only the data in SDCs for the flag cells are set to "1" via IO and IOn. The data in SDC is then copied to PDC and DDC (S41). The data read from the cell is transferred to PDC. If any data has been written to the flag cell, PDC for the flag cell is at the high level. If no data has been written to the flag cell, PDC for the flag cell is at the low level.

Then, TDCs in all the data storage circuits are set to Vss. The signals VREG and REG are then set to the high level. This sets only TDCs in the flag cell data storage circuits to the high level. TDCs in the other data storage circuits are set to the low level.

Then, the signal line COMi, shown in FIG. 6, is precharged to Vdd. The signal CHK2$n$ is subsequently set to the low level, and then the signal CHK1 is set to the high level. The signal line COMi is set the high level only when the flag cell PDC is at the low level, that is, when no data has been written to the flag cell.

On the other hand, the signal line COMi is set to the low level when the flag cell PDC is at the high level, that is, when data has been written to the flag cell. Since TDCs in the data storage circuits other than those for the flag cells are at the low level, the data in TDCs are not reflected in the signal line COMi. Determination is thus made as to whether or not data has been written to the flag cell without transferring the flag cell data to SDC. Charging of the signal line COMi and determination of level of the signal line COMi are carried out by the control signal and control voltage generating circuit 7.

If the data read from the second flag cell is "0" (memory cell data is "2"), a write operation has been performed on the second page. Thus, the distribution of the threshold voltages in the cell is as shown in FIG. 8C. To make a determination for the data in the cell, it is possible to perform a read operation with the potential of the word line set to "b". However, the result of a read operation with the word line potential "b" has already been read out. Consequently, transferring the data from PDC to SDC enables the data to be output to the external device (S44 and S45).

If the data read from the flag cell is "1" (memory cell data is "0"), a write operation has not been performed on the second page. Thus, the distribution of the threshold voltages in the cell is as shown in FIG. 8A or 8D. To make a determination for the data in the memory, it is necessary to perform a read operation with the potential of the word line set to "a". Accordingly, the control signal and control voltage generating circuit 7 performs a read operation with the potential of the word line set to "a" (S43). The data read to PDC is subsequently transferred to SDC (S44) and then output to the external device (S45).

(Second Page Read)

FIGS. 12B and 13 show diagrams of a second page read operation. First, an address is specified to select two pages shown in FIG. 3. That is, as shown in FIG. 13, the address input command "00$h$" and an address Add are sequentially input, and the read start command "30$h$" is then input.

As shown in FIGS. 8A, 8B, and 8C, a second page write operation changes the distribution of threshold voltages. After the second page write operation, the distribution is as shown in FIG. 8C.

First, a read operation is performed with the word line potential set to "c" (S51). A read operation is subsequently performed with the word line potential set to "a". If the threshold voltage of the cell is lower than the word line potential "a" or higher than the word line potential "c", the data is "1". If the threshold voltage of the cell is higher than the word line potential "a" and lower than the word line potential "c", the data is "0". During this read operation, the data in the nodes N2$a$ in SDCs in all the data storage circuits are set to "0", and then only the data in SDCs for the flag cells are set to "1" via IO and IOn. The data in SDC is then copied to PDC and DDC (S52).

The data read from the cell is held in PDC. If data has been written to the flag cell, the flag cell PDC is set to the high level. If no data has been written to the flag cell, the flag cell PDC is set to the low level. Then, TDCs in all the data storage circuits are set to Vss, and the signals VREG and REG are then set to the high level. This sets only TDCs in the flag cell data storage circuits to the high level, while setting TDCs in the other data storage circuits to the low level.

Then, the signal line COMi in FIG. 6 is precharged to Vdd. The signal CHK2$n$ is subsequently set to the low level, and then the signal CHK1 is set to the high level. The signal line COMi is set the high level only when the flag cell PDC is at the low level, that is, when no data has been written to the flag cell.

On the other hand, the signal line COMi is set to the low level when the flag cell PDC is at the high level, that is, when data has been written to the flag cell. Since TDCs in the data storage circuits other than those for the flag cells are at the low level, the data in TDCs are not reflected in the signal line COMi. Determination can thus be made as to whether or not data has been written to the flag cell without transferring the flag cell data to SDC.

Before a second page write operation, "1" should be output as second page data. However, the distribution of threshold voltages is as shown in FIG. 8A or 8B. Thus, performing a read operation in the same manner as that performed after a second page write operation may result in the output of the data "0". Accordingly, a determination is made as to whether the first flag cell data is "0" or "1" (S53). Then, if the first flag cell data is "1", indicating that a second page write operation has not been performed, N1$a$ in PDC is set to a fixed value (S54). The data read to PDC is transferred to SDC (S55) and then output to the external device (S56). If the first flag cell data is "0", the data read to PDC is transferred to SDC (S55) and then output to the external device (S56).

(Cache Read)

Figure 1:
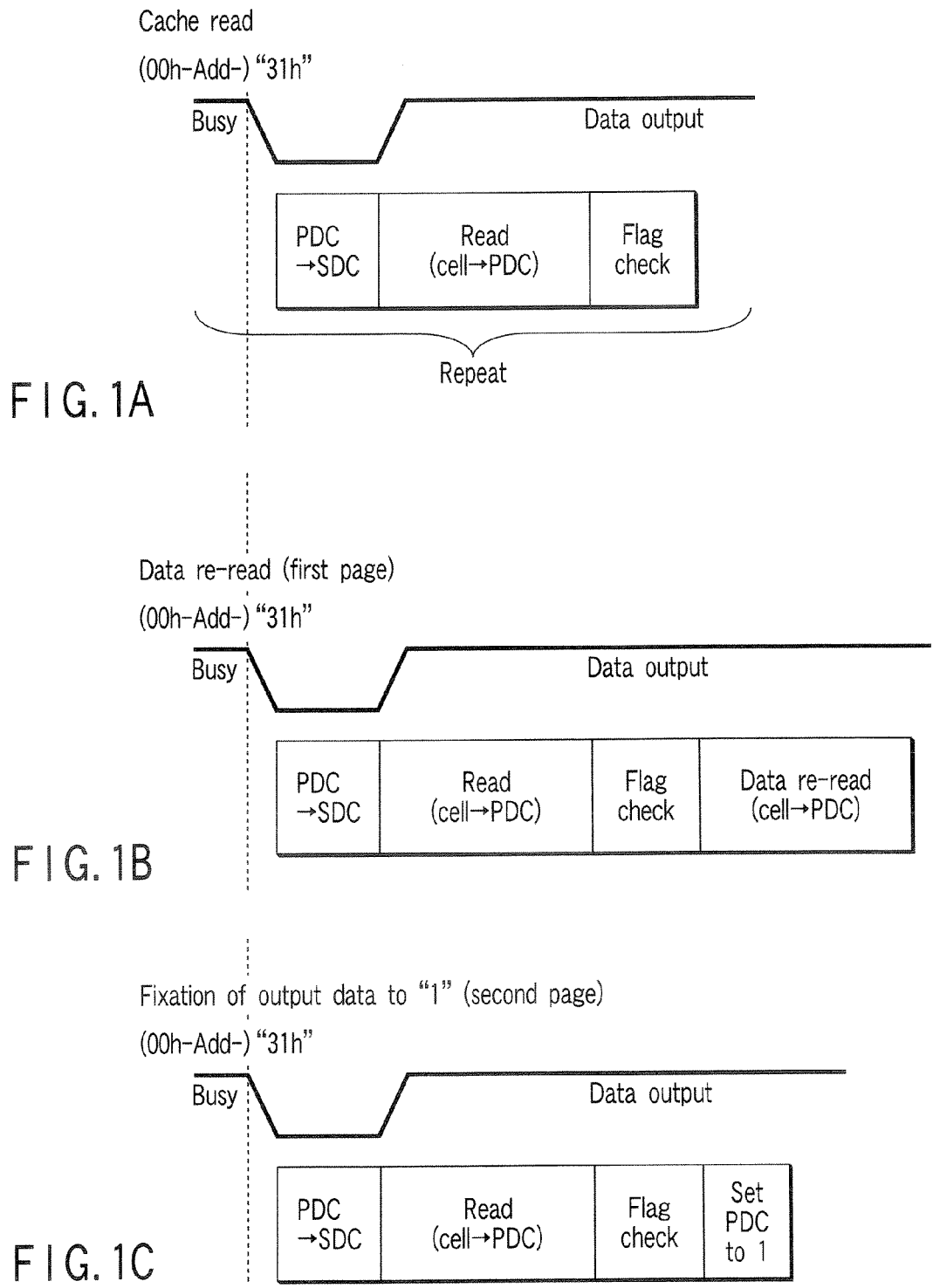
FIGS. 1A, 1B, and 1C are timing charts showing operations in accordance with a first embodiment.
Figure 14A:
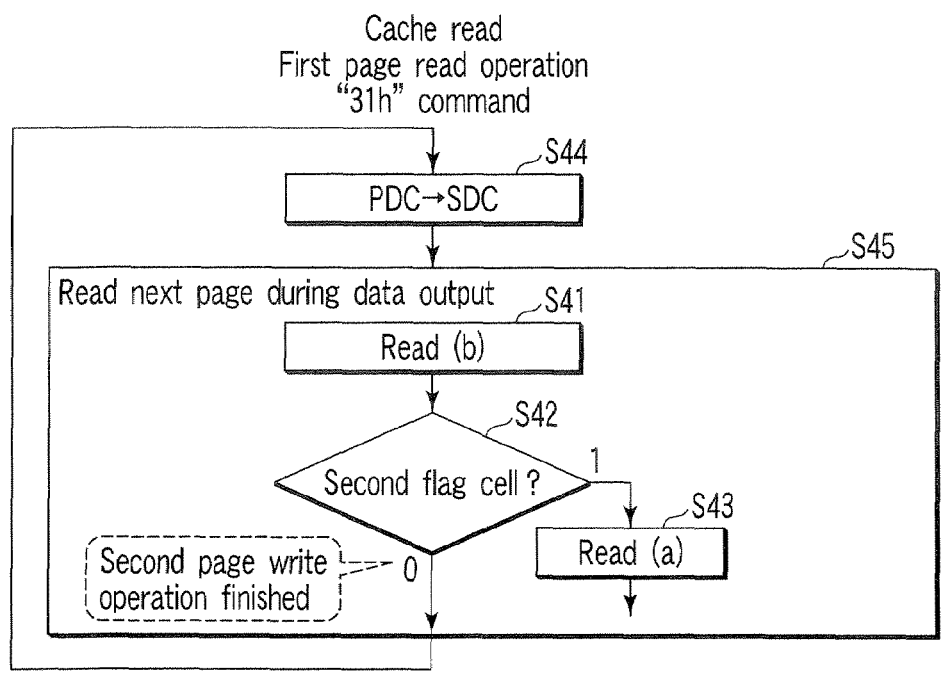
FIGS. 14A and 14B are flowcharts showing a cache read operation in accordance with the first embodiment.
Figure 14B:
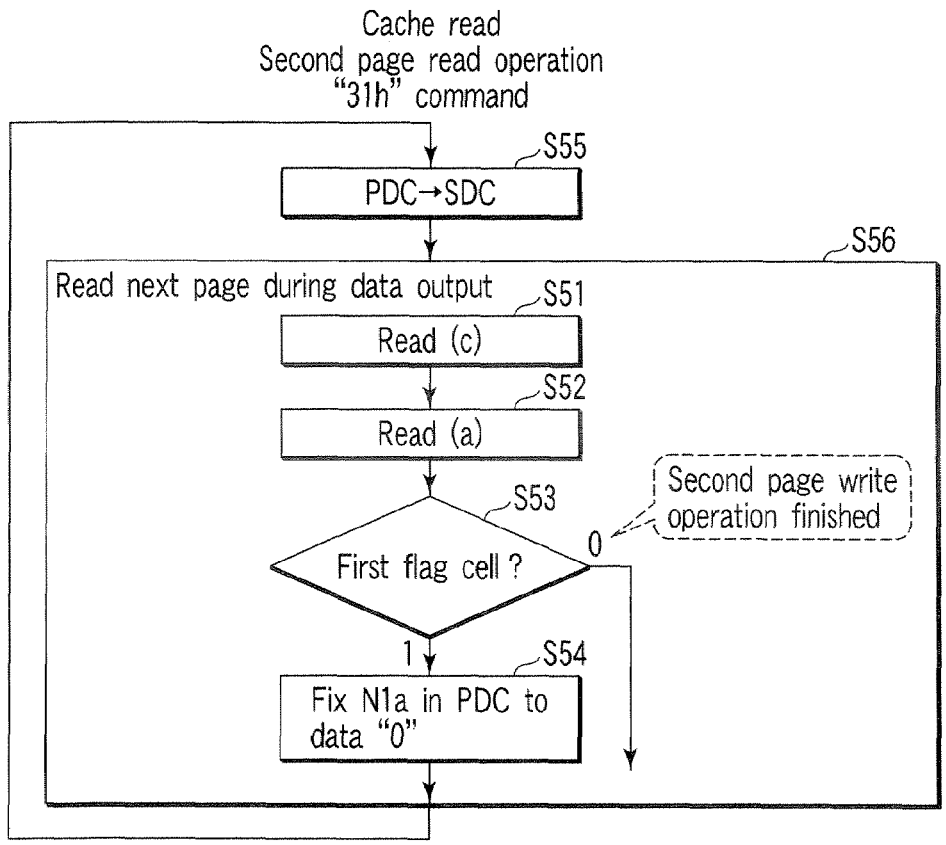

FIGS. 1A, 1B, and 1C show timing charts of a cache read operation. FIGS. 14A and 14B show flowcharts of the cache read operation. In FIGS. 14A and 14B, the same components as those in FIGS. 12A and 12B are denoted by the same reference numerals.

A cache read operation starts with the above read operation. That is, as shown in FIG. 13, the address input command "00$h$" and the address Add are sequentially input, and the read start command "30$h$" is then input. This brings the semiconductor memory device into the busy state. In this state, data is read from the memory cell as is the case with the above read operation. The data read from the memory cell is held in PDC. The data in PDC is subsequently transferred to SDC. This brings the semiconductor memory device into the ready state to allow the data in SDC to be output.

Then, as shown in FIG. 1A, the input of the cache read command "31$h$" causes the data in PDC to be transferred to SDC. This brings the semiconductor memory device into the ready state to allow the data in SDC to be output. Since the cache read command also enables an address to be input and thus specifies the next address to be read. Then, during the output of the data from SDC to the external device, the next page data is read from the cell and then held in PDC. Determination is then made for the flag cell data.

That is, for the first page read operation shown in FIGS. 1B and 14B, the input of the cache read command "31$h$" the cache read command "31$h$" causes the data in PDC to be transferred to SDC (S44) to allow the data to be output (S45). During the output of the data from SDC to the external device, the next page data is read from the cell and then held in PDC. Determination is then made for the flag cell data (S41 and S42). If the second flag cell data is "1", a re-read operation is performed with the potential of the word line set to "a" (S43). In this state, the input of another cache read command causes the data in PDC to be transferred to SDC, with operations similar to those described above repeated.

For the second page read operation shown in FIGS. 1C and 14B, as in the case of the first page read operation, the data in PDC is transferred to SDC in response to the cache read command (S55), allowing the data to be output (S56). During the output of the data from SDC to the external device, the following operations are performed: reading of the second page data, determination for the first flag cell, and fixation of the output data to "1" (S51 to S54).

Thus, during the output of the data from SDC to the external device, reading of the next page data and a flag check are repeated, enabling high-speed cache read operations.

With the conventional techniques, if during the first page cache read operation, the memory cell data is re-read using the flag cell data, the period of the busy state may unfortunately last long after the issuance of the cache read command. However, as shown in FIG. 1B, the first embodiment re-reads the data during the output of the data from SDC to the external device. This avoids affecting the busy state. Moreover, as shown in FIG. 1C, the fixation of the output data to "1" for the second page read operation is also performed during the output of the data from SDC to the external device. This also avoids affecting the busy state.

The cache read operation shown in FIGS. 1A, 1B, and 1C does not involve the operation of setting only the flag cell SDCs to "1" while setting the other SDCs to "0", which is otherwise performed during bit line discharge shown in FIG. 13. The reason is that one read operation is always performed before a cache read operation to load data into SDC. However, as shown in FIGS. 1A, 1B, and 1C, the time required for data output is longer than that required for a read operation and determination for the flag cell data. Further, since DDC is a nonvolatile cache like DRAM, the data in DDC may disappear during data output. This requires DDC to be constantly refreshed.

Figure 15A:
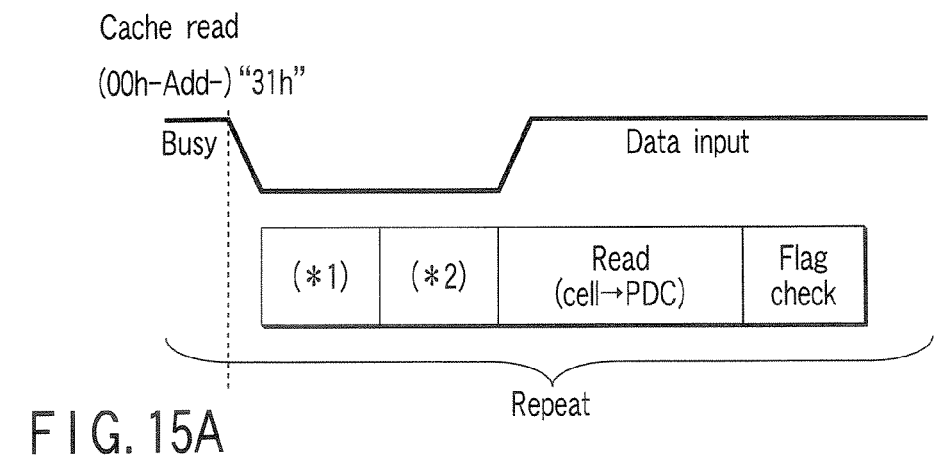
FIGS. 15A, 15B, and 15C are timing charts showing a modification of a cache read operation in accordance with the first embodiment.
Figure 15B:
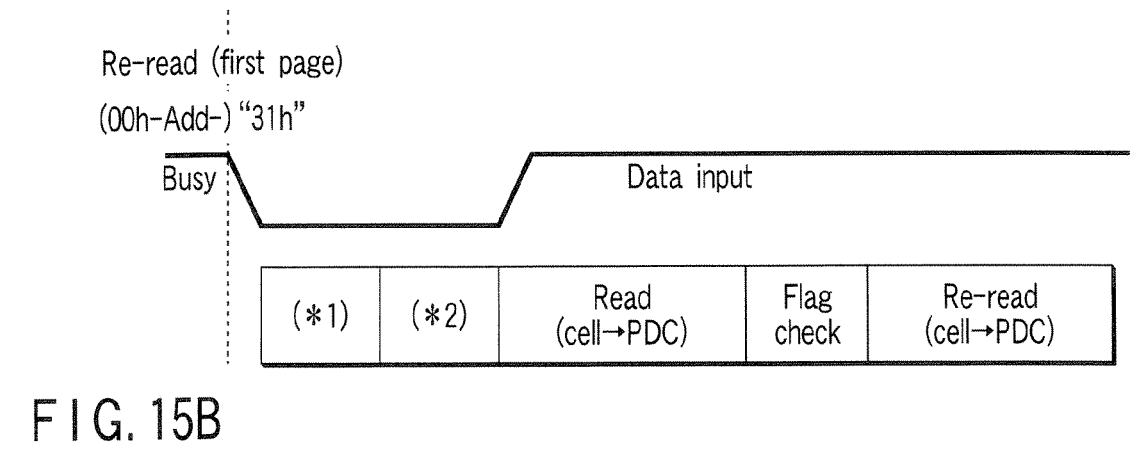
Figure 15C:
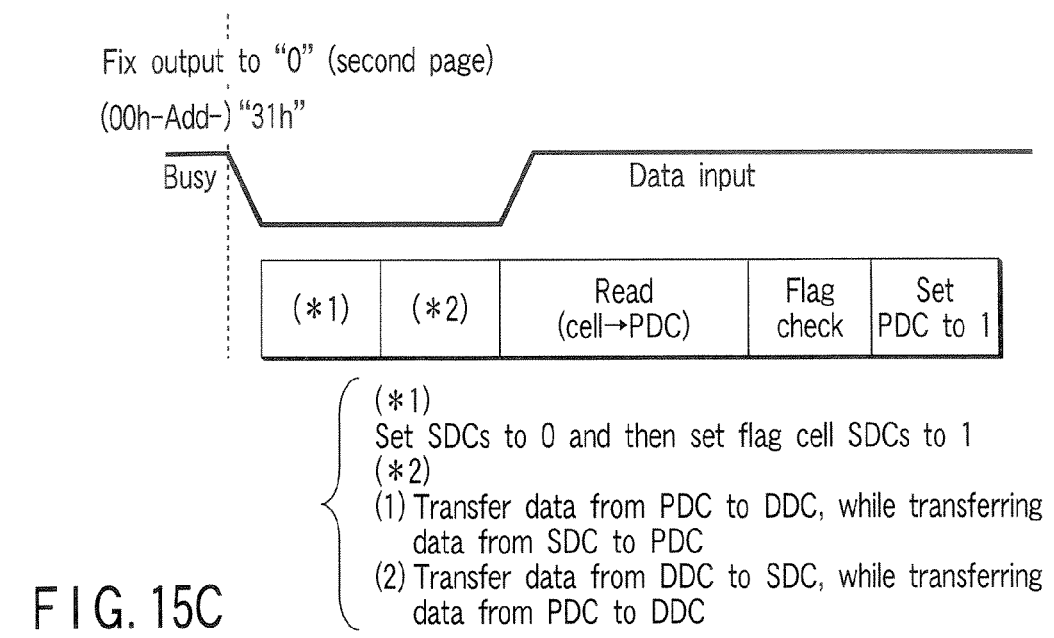

FIGS. 15A, 15B, and 15C show a modification of the cache read operation in accordance with the first embodiment. In FIGS. 15A, 15B, and 15C, before a read operation performed in the ready state (data output), that is, during every busy state, only the flag cell SDCs are set to "1", while the other SDCs are set to "0". These data are set in DDC via PDC. That is, first, only the flag cell SDCs are set to "1", while the other SDCs are set to "0" (*1). The data in PDC is subsequently transferred to DDC, while the data in SDC is transferred to PDC. The data in DDC is further transferred to SDC, while the data in PDC is transferred to DDC (*2).

This modification slightly increases the period of the busy state for a cache read operation compared to the embodiment shown in FIGS. 1A, 1B, and 1C but eliminates the need to constantly refresh DDC. Therefore, slightly increasing the period of the busy state ensures the retention of the data in DDC.

(Erase)

In an erase operation, first, an address is specified to select a block shown by a dashed line in FIG. 3. The erase operation sets the data in the memory cell to "0" to output the data "1" regardless of whether a read operation is performed on the first page or the second page.

According to the first embodiment, determinations are made for the first and second flag cells while the first and second flag cell data are being detected via the signal COMi and output to the external device through SDC. This eliminates the need for detections after the transfer of the data in PDC to SDC, enabling high-speed read operations.

Further, in the second and subsequent cache read operations, the following is carried out during the output of the data from SDC: the data is read from the memory cell and held in PDC and determinations are made for the first and second flag cell data, while an operation of re-reading the data or fixing the output data is performed. Consequently, only the transfer of the data from PDC to SDC is executed during the busy state, enabling an increase in the speed of the cache read operations.

The first embodiment uses the single first flag cell and the single second flag cell. However, the present invention is not limited to this. With the single first flag cell and the single second flag cell, it is difficult to reliably read the first and second page data if the data stored in the first and second flag cells are degraded. Thus, each of the first and second flag cells is composed of a plurality of cells so as to make determinations by the majority of the data in the plurality of first flag cells and the data in the plurality of second flag cells. This configuration allows the first and second page data to be reliably read even if any data in the first and second flag cells is degraded.

The first embodiment precharges the signal COMi and then determines the states of the first and second flag cells depending on whether or not the signal line COMi is discharged. However, determinations may be made by the majority of the plurality of flag cells by connecting, for example, an operational amplifier (OPamp) to the node of the signal line COMi so that the operational amplifier can monitor a plurality of PDCs for the number of transistors that are on.

According to the first embodiment, the second page write operation is preformed so as to change the memory cell data from "0" to "1" using the first flag cell and to change the memory cell data from "0" to "2" using the second flag cell. However, the present invention is not limited to this. As shown in FIG. 8C, the first flag cell may be omitted if the threshold voltage of the second flag cell is lower than the threshold voltage "c" of the memory cell.

Further, according to the first embodiment, the second page write operation is preformed so as to change the memory cell data from "0" to "1" using the first flag cell and to change the memory cell data from "0" to "2" using the second flag cell. However, the cell main body involves only the write operation of changing the memory cell data from "0" to "1" and from "2" to "3". The write operation with the second flag cell may hinder an increase in speed. In this case, the first flag cell alone may be used and not the second flag cell.

Second Embodiment

FIG. 16 shows a second embodiment. A defective bit line is replaced with a spare bit line. The replacement of a bit line is executed in terms of bytes. The present modification makes it possible to detect the completion of a write operation even if any bit line is replaced with a spare bit line.

In FIG. 16, each verify detecting circuit 61 is connected to a number of data storage circuits 10 for 1 byte or word, for example, 8 or 16 data storage circuits 10. Specifically, each of the signal lines COM0 to COMi is connected to the data storage circuits 10 for 1 byte or word, with the verify detecting circuit 61 connected to each of the signals lines COM0 to COMi. The verify detecting circuit 61 comprises P channel MOS transistors 61a, 61b, and 61c, N channel MOS transistors 61d, 61e, and 61f, and capacitors 61h and 61i.

The signals line COM of the 8 or 16 data storage circuits 10 is connected to the gate of the transistor 61a. The transistor 61c is connected between the gate of the transistor 61a and the node to which the power Vdd is supplied. A signal COMHn is supplied to the gate of the transistor 61c. The transistor 61c charges the signal line COM in accordance with the signal COMHn. The capacitor 61h is also connected between the gate of the transistor 61a and the ground. One end of the current path extending through the transistor 61a is connected to the node to which the power Vdd is supplied. The other end of the current path is grounded via the transistors 61b and 61d. A signal RDD is supplied to the gate of the transistor 61b. A signal COLDRST is supplied to the gate of the transistor 61d. The signal RDD is normally at the low level and changes to the high level if any defective bit line connected to the 8 or 16 data storage circuits connected to the flag detecting circuit 61 is replaced with a spare bit line. Thus, the signal RDD at the high level stops the operation of the flag detecting circuit 61.

The connection node between the transistors 61b and 61d is connected to the gate of the transistor 61e. The capacitor 61i is connected between the gate of the transistor 61e and the ground. One end of the current path extending through the transistor 61e is connected to a common signal line LSEN connected to all the data storage circuits 10. The other end of the current path is grounded via the transistor 61f. A signal SDEN is supplied to the gate of the transistor 61f. The signal COLDRST is a reset signal, and the signal SDEN is an enable signal that activates the verify detecting circuit 61.

In the above configuration, first, the signal COLDRST is set to the high level. The transistor 61d is then turned on to reset a connection node NCOM to the ground potential. Changing the signal COLDRST to the low level sets the signal SDEN to the high level to turn on the transistor 61f. The signal line LSEN is already charged to the high level.

Subsequently, with the flag cell data read out, if any of the signal lines COM connected to the 8 or 16 data storage circuits changes 10 to the low level, the corresponding transistor 61a is turned on. If the bit line has not been replaced with a spare bit line, the signal RDD is at the low level. Thus, the transistor 61b is on, and turning on the transistor 61a turns on the transistor 61e. Consequently, the signal line LSEN is discharged via the transistors 61e and 61f and thus changes to the low level.

If all the signals lines COM are at the high level, the transistor 61a remains off, and the signal line LSEN maintains the high level. This makes it possible to detect the completion of a write operation.

The second embodiment provides the verify detecting circuit 61 for each signal line COM for 1 byte or word and connects the signal line LSEN to the output terminals of all the verify detecting circuits 61. The verify detecting circuit 61 thus detects the level of the signal line COM to control the level of the signal line LSEN. Further, if the signal RDD indicates that the corresponding bit line has been replaced with a spare bit line, the verify detecting circuit 61 is set inoperative. This makes it possible to detect the completion of a write operation even if the bit line has been replaced with a spare bit line.

If a plurality of flag cells are provided as previously described, different signals CHK1 are provided for the respective bits 0 to 7 or 0 to 15 of 1 byte or word so that selection of one of the signals CHK1 allows the corresponding one of the flag cells to be selected. Then, a determination can be made for the flag cell data by majority by, for example, counting the number of flag cells at the high level.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array having a plurality of memory cells arranged in rows and in columns, the memory cell array having a plurality of bit lines connected to the plurality of memory cells arranged in the columns;
    n (n is a natural number equal to or larger than 2) data storage circuits connected to the respective bit lines, each of the data storage circuits having a first storage storing 1 bit data;
    a common interconnection connected to the n first storage sections; and
    a control section coupled to the common interconnection, wherein the control section reads data from k (k<n and is not 0) of the data storage circuits via the common interconnection when the data of a selected data storage circuit of the n data storage circuits are output to a data I/O line,
    wherein each of the n data storage circuits includes a second storage section storing 1 bit data, the k (k<n and is not 0) of the n second storage sections store first logical data, and (n−k) of the n second storage sections store second logical data, and the control section reads data from k (k<n and is not 0) of the data storage circuits which store the first logical data in the second storage section via the common interconnection.

2. The device according to claim 1, wherein the data storage circuit has a third storage section connected to an I/O line to hold data to be read and data to be written.

3. The device according to claim 2, wherein while outputting the data stored in the third storage section to the data I/O line or supplying a data from the data I/O line to the third storage section, the control section stores the data read from the memory cell in the first storage section.

4. The device according to claim 2, wherein while outputting the data stored in the third storage section to the data I/O line or supplying a data from the data I/O line to the third storage section, the control section uses the common interconnection to read the data stored in the first storage section.

5. The device according to claim 2, wherein while outputting the data stored in the third storage section to the data I/O line or supplying a data from the data I/O line to the third storage section, the control section uses the common interconnection to make a determination for the data stored in the first storage section and to read data from the memory cell again.

6. The device according to claim 2, wherein while outputting the data stored in the third storage section to the data I/O line or supplying a data from the data I/O line to the third storage section, the control section sets the data stored in the first storage section to particular data.

7. The device according to claim 2, wherein the memory cell array has a flag cell, and the control section make a determination for data read from the flag cell to the first storage section, via the common interconnection.

8. A semiconductor memory device comprising:
    memory cells each having a threshold of k (k is a natural number equal to or larger than 2) values;

a data storage circuit which stores either data read from the memory cell or externally input data, the data storage circuit having a first storage section and a second storage section each of which stores 1 bit; and a control circuit which performs a write operation of setting the memory cell to a threshold of n (n<=k) values according to the data in the first storage section and the second storage section and which, after at least one value is written to the memory cell, suspends the write operation, performs a read operation on the memory cells, stores read data in the first storage section, and then resumes the write operation.

9. The device according to claim 8, wherein the control section outputs the data in the first storage section to an external device during the resumed write operation.

10. The device according to claim 8, wherein the control section allows next write data to be externally input to the first storage section during the resumed write operation.

11. The device according to claim 8, wherein after the external input of the read command, the semiconductor memory device suspends the write operation and performs a read operation on the memory cell.

12. A semiconductor memory device comprising:
memory cells each having a threshold of k (k is a natural number equal to or larger than 2) values;

a data storage circuit which stores either data read from the memory cell or externally input data, the data storage circuit having i (i is a natural number equal to or larger than 2) storage section each of which stores 1 bit; and a control circuit which performs a write operation of setting each of the memory cells to a threshold of n (n<=k) values according to the data in the storage sections and which, after at least one value is written to the memory cell, suspends the write operation, performs a read operation on the memory cells, stores read data in at least one of the storage sections, and then resumes the write operation.

13. The device according to claim 12, wherein the control section outputs the read data stored in the one of the storage sections to an external device during the resumed write operation.

14. The device according to claim 12, wherein the control section allows next write data to be externally input to the storage section in which the read data is stored, during the resumed write operation.

15. The device according to claim 12, wherein the control section to make a determination the data read from the memory by using the common interconnection, and reads the data from the memory cell again in accordance with the determination.

16. The device according to claim 12, wherein after external input of a read command, the semiconductor memory device suspends the write operation and performs a read operation on the memory cell.

17. A semiconductor memory device comprising:
memory cells each having a threshold of k (k is a natural number equal to or larger than 2) values;

a data storage circuit which stores either data read from the memory cell or externally input data, the data storage circuit having i (i is a natural number equal to or larger than 2) storage section each of which stores 1 bit; and a control section which performs a write operation of setting each of the memory cells to a threshold of n (n<=k) values according to the data in the storage section and which, after external input of a read command, suspends the write operation, performs a read operation on the memory cell, stores read data in at least one of the storage sections, and then resumes the write operation.

18. The device according to claim 17, wherein the control section outputs the read data stored in the one of the storage sections to an external device during the resumed write operation.

19. The device according to claim 17, wherein the control section allows next write data to be externally input to the storage section in which the read data is stored, during the resumed write operation.

20. The device according to claim 12, wherein the n is $2^i$.

21. The device according to claim 12, wherein the n is $2^{(i-1)}$.

22. The device according to claim 12, wherein the n is $2^{(i-2)}$.

23. The device according to claim 17, wherein the n is $2^i$.

24. The device according to claim 17, wherein the n is $2^{(i-1)}$.

25. The device according to claim 17, wherein the n is $2^{(i-2)}$.

* * * * *